(12) United States Patent
Pagnanelli

(10) Patent No.: US 8,581,768 B1
(45) Date of Patent: Nov. 12, 2013

(54) LINEAR TO DISCRETE QUANTIZATION CONVERSION WITH REDUCED SAMPLING VARIATION ERRORS

(75) Inventor: Christopher Pagnanelli, Huntington Beach, CA (US)

(73) Assignee: Syntropy Systems, LLC, Costa Mesa, CA (US)

( * ) Notice: Subject to any disclaimer, the term of this patent is extended or adjusted under 35 U.S.C. 154(b) by 0 days.

(21) Appl. No.: 13/535,037

(22) Filed: Jun. 27, 2012

Related U.S. Application Data

(60) Provisional application No. 61/549,739, filed on Oct. 20, 2011, provisional application No. 61/554,918, filed on Nov. 2, 2011, provisional application No. 61/536,003, filed on Sep. 18, 2011, provisional application No. 61/501,284, filed on Jun. 27, 2011.

(51) Int. Cl.
    *H03M 1/12* (2006.01)
(52) U.S. Cl.
    USPC ............................................ 341/155; 341/143
(58) Field of Classification Search
    USPC ................. 341/144, 159, 122, 143, 123, 139
    See application file for complete search history.

(56) References Cited

U.S. PATENT DOCUMENTS

| | | | | |
|---|---|---|---|---|
| 6,683,919 | B1* | 1/2004 | Olgaard et al. | 375/316 |
| 7,224,939 | B2* | 5/2007 | Takayama et al. | 455/45 |
| 7,324,036 | B2* | 1/2008 | Petre et al. | 341/155 |
| 8,089,382 | B2* | 1/2012 | Pagnanelli | 341/143 |
| 2010/0130156 | A1* | 5/2010 | Jin et al. | 455/296 |
| 2012/0322399 | A1* | 12/2012 | Sheikholeslami | 455/334 |

OTHER PUBLICATIONS

Mazlouman, S., "Digital Compensation Techniques for Frequency-Translating Hybrid Analog-to-Digital Converters", IEEE Transactions on Instrumentation and Measurement, vol. 60, No. 3, 2011.
Petraglia, A., "High Speed A/D Conversion using QMF Filter Banks", Proceedings: IEEE International Symposium on Circuits and Systems, 1990.
Velazquez, S., "Design of Hybrid Filter Banks for Analog/Digital Conversion", IEEE Transactions on Signal Processing, vol. 46, No. 4, 1998.
Ding, G., "Frequency-Interleaving Technique for High-Speed A/D Conversion", Proceedings: IEEE International Symposium on Circuits and Systems, 2003.
Aziz, P., "Multi Band Sigma Delta Analog to Digital Conversion", IEEE International Conference on Acoustics, Speech, and Signal Processing, 1994.
Smilkstein, T., "Jitter Reduction on High-Speed Clock Signals" (PhD Thesis), University of California, Berkeley, 2007.

* cited by examiner

Primary Examiner — Peguy Jean Pierre
(74) Attorney, Agent, or Firm — Joseph G. Swan, P.C.

(57) ABSTRACT

Provided is, among other things, an apparatus that includes an input line for accepting an input signal that is continuous in time and continuously variable. Multiple processing branches are coupled to the input line, each including: (a) an analog bandpass filter, (b) a sampling/quantization circuit coupled to an output of the analog bandpass filter, and (c) a digital bandpass filter coupled to an output of the sampling/quantization circuit. An adder is coupled to outputs of the processing branches. The digital bandpass filters in different ones of the processing branches have frequency response bandwidths that are centered at different frequencies, and the analog bandpass filters in different ones of the processing branches have frequency responses with bandwidths that are at least 25% greater than the frequency response bandwidths of the digital bandpass filters in their respective processing branches.

69 Claims, 19 Drawing Sheets

LINEAR TO DISCRETE QUANTIZATION CONVERSION WITH REDUCED SAMPLING VARIATION ERRORS

This application claims the benefit of U.S. Provisional Patent Application Ser. No. 61/549,739 (the '739 Application), filed on Oct. 20, 2011; U.S. Provisional Patent Application Ser. No. 61/554,918 (the '918 Application), filed on Nov. 2, 2011; U.S. Provisional Patent Application Ser. No. 61/536,003 (the '003 Application), filed on Sep. 18, 2011, and titled "Method and Apparatus for Reducing Frequency Drift"; and U.S. Provisional Patent Application Ser. No. 61/501,284, filed on Jun. 27, 2011, and titled "Sampling/Quantization Converters". The foregoing applications are incorporated by reference herein as though set forth herein in full.

FIELD OF THE INVENTION

The present invention pertains to systems, methods and techniques for reducing errors caused by sampling uncertainty in converting continuous-time continuously variable signals into a sampled, quantized signals. It is particularly applicable to very high sample-rate data converters that quantize high-frequency input signals with high precision.

BACKGROUND

Many applications in modern electronics require that continuous-time signals be converted to discrete signals for processing using digital computers and signal processors. Conventionally, this transformation is made using a method similar to converter circuit 5, illustrated in FIG. 1. Circuit 5 converts analog input 6 (i.e., both continuous in time and continuously variable) to discrete digital output 16 (i.e., both sampled in time and quantized in value) using lowpass filter 8, sample-and-hold circuit 10 (sampler), and quantizer 14. The instantaneous bandwidth of such a sampled system is limited by the Nyquist criterion to a maximum theoretical value equal to one-half the sample clock ($f_{CLK}$) frequency (i.e., the Nyquist limit). Therefore, the purpose of lowpass filter 8, in circuit 5, is to reject frequencies above the Nyquist limit, so that discrete output 16 is not corrupted by errors related to aliasing. For this reason, filter 8 is often referred to in the prior art as an anti-aliasing filter. At intervals determined by clock frequency 12, sample-and-hold circuit 10 captures the output value of anti-aliasing filter 8 (i.e., an analog signal), and holds that value while quantizer 14 produces, using a rounding operation, a discrete-time, discretely-valued output 16 (i.e., a digital signal). The number of discrete levels in the rounding operation of quantizer 14 determines the conversion resolution, or maximum precision, associated with analog-to-digital converter circuit 5. Converter precision is often specified as an effective number of bits (ENOB), such that for Q levels in the rounding operation, the ENOB is less than or equal to $\log_2(Q)$.

In general, the precision of an analog-to-digital converter (ADC) is less than $\log_2(Q)$ because of impairments such as sampling uncertainty, or timing jitter, that degrade the accuracy of the sampling/quantization operation and reduce the quality of the conversion process. Although one source of sampling uncertainty is the inability of sample-and-hold circuit 10 to consistently capture signals on the transitions (i.e., rising and falling edges) of sample clock 12, a primary source of sampling jitter/uncertainty in conventional ADCs tends to be the sample clock source itself. The sample clock is produced by a circuit, often called an oscillator, which conventionally includes a network that is resonant at a particular frequency (i.e., a resonator). FIG. 2A is an exemplary conventional oscillator known as a Pierce oscillator. Sampling jitter/uncertainty results when the oscillator output frequency varies or drifts over time due to resonator instabilities, and/or other circuit imperfections. Fluctuations in oscillator output frequency and/or phase are generally classified according to the time scale over which the fluctuations occur. For example, rapid fluctuations in oscillator output frequency, such as those having periods on the order of nanoseconds to microseconds, are referred to as short-term jitter, or high-frequency jitter (i.e., white phase noise). Conversely, slow fluctuations in oscillator output frequency, such as those having periods on the order of milliseconds to tenths of seconds, are referred to as long-term jitter or low-frequency jitter (i.e., flicker-phase noise or white-frequency noise). Finally, extremely slow fluctuations in oscillator output frequency, such as those with periods on the order of seconds to many seconds, are referred to as wander (i.e., flicker-frequency noise or random frequency walk). FIG. 2B provides a classification of clock frequency instability based on the rate of variation exhibited by the fluctuations in the oscillator output. As shown in FIG. 2B, low-frequency jitter and wander typically have greater magnitudes than high-frequency jitter.

To illustrate the effects of sampling jitter on an ADC, it is informative to consider first the case of a narrowband (sinusoidal) input signal, such as $x(t) = A_m \cdot \sin(\omega_m t + \phi_m)$, with arbitrary amplitude ($A_m$), arbitrary phase ($\phi_m$), and angular frequency $\omega_m < \frac{1}{2} \cdot f_{CLK}$. Assuming infinite resolution (i.e., number of rounding levels $Q \to \infty$), the discrete-time output of the converter is given by $$\hat{y}_k(n) = A_m \sin(\omega_m T \cdot n + \phi_m + \omega_m \cdot \phi),$$

where the sampling interval $T = 1/f_{CLK}$ and $\phi$ is a white, Gaussian noise sequence produced by sampling jitter (uncertainty) having power $\sigma_\phi^2$ and power spectral density $N_0$ (i.e., $N_0 = \sigma_\phi^2 / \frac{1}{2} \cdot f_{CLK}$). For the case where $|\phi| \ll 1$, which is typical for high-precision clock sources, it is relatively straightforward for those skilled in the art to show that $$\hat{y}_n(n) \approx A_m \cdot \sin(\omega_m T \cdot n + \phi_m) + A_m \cdot \cos(\omega_m T \cdot n + \phi_m) \cdot (\omega_m \cdot \phi),$$

where the first term in the above equation is the sampled input signal and the second term is noise introduced by sampling jitter. The power in the noise term increases with the square of the input angular frequency $\omega_m$ according to $P_{Noise} = \frac{1}{2} \cdot A_m^2 \cdot \sigma_\phi^2 \cdot \omega_m^2$, and this noise adds directly to the converter output to degrade conversion accuracy. Specifically, the effective resolution (i.e., ENOB) of a data converter degrades by 0.5 bits for every factor of two increase in output noise.

The jitter analysis above can be extended to the case of a broadband input signal by considering that any real, bandlimited signal can be approximated by a finite sum of sinusoids via a Fourier series. In analyzing the effects of sampling jitter, therefore, it is convenient to represent a broadband input signal (x), with bandwidth $f_B$, as the sum of K sinusoids having arbitrary amplitude and arbitrary phase, where $$x(t) = \sum_{k=0}^{K-1} A_k \cdot \sin(\omega_k t + \phi_k),$$

amplitude values $A_k$ are uniformly distributed over the interval $[-1, 1]$, phase values $\phi_k$ are uniformly distributed over the interval $(-\pi, +\pi)$, and angular frequency values $\omega_k$ are uniformly distributed over the interval $[0, 2\pi \cdot f_B]$ (i.e., $\omega_0 = 0$ and $\omega_{K-1}=2\pi \cdot f_B$). Again assuming infinite resolution (i.e., number of rounding levels $Q \rightarrow \infty$), the discrete-time output of the converter is given by $$\hat{y}_k(n) = \sum_{k=0}^{K-1} A_k \sin(\omega_k T \cdot n + \phi_k + \omega_k \cdot \varphi)$$

$$\approx \sum_{k=0}^{K-1} A_k \cdot \sin(\omega_k T \cdot n + \phi_k) +$$

$$\sum_{k=0}^{K-1} A_k \cdot \cos(\omega_k T \cdot n + \phi_k) \cdot (\omega_k \cdot \varphi)$$

where the second term, which is the output noise introduced by sampling jitter, has $$P_{noise} = \frac{1}{2} \cdot K \cdot E\{A_k^2\} \cdot \sigma_\varphi^2 \cdot \frac{1}{K} \cdot \sum_{k=0}^{K-1} \omega_k^2.$$

power
As $K \rightarrow \infty$ the power in the noise term converges to $$P_{noise} = \frac{1}{3} \cdot \sigma_S^2 \cdot \sigma_\varphi^2 \cdot (2\pi \cdot f_B)^2,$$

where $\sigma_S^2$ is the input signal power. Therefore, the extent to which sampling jitter degrades conversion accuracy is proportional to the square of the input signal bandwidth $f_B$.

As a result of the above analysis, the present inventor has indentified a need for minimizing the effects of sampling jitter in data converter circuits, particularly those that are required to process input signals with high-frequency content (i.e., large $\omega_k$), or wide bandwidth (i.e., large $f_B$). To overcome the processing speed limitations of electronic circuits, high-frequency converters conventionally employ an arrangement where multiple, distinct converters are operated in parallel (i.e., parallel processing). Conventional parallel processing arrangements include time-interleaving (time-slicing) converters and frequency-interleaving (frequency-slicing) converters. For interleaving in time, a high-speed sample clock is decomposed into lower-speed sample clocks at different phases. Each converter in the time-interleaving array is clocked with a different clock phase, such that the conversion operation is distributed in time across multiple converters (i.e., polyphase decomposition). While converter #1 is processing the first sample, converter #2 is processing the next sample, and so on.

For interleaving in frequency, the total bandwidth of the continuous-time signal is uniformly decomposed (i.e., divided) into multiple, narrowband segments (i.e., sub-bands). Each parallel processing branch converts one narrowband segment, and all the converter processing branches operate from a single, common sampling clock. According to one representative implementation of a frequency-interleaving ADC 30A, shown in FIG. 3A, the individual bands are separated out and downconverted to baseband. More specifically, the input signal 31 is provided to a set of multipliers 32A together with the band's central frequencies 33A-35A. The resulting baseband signals are then provided to identical, lowpass filters 36A that are designed to spectrally decompose the input signal (i.e., signal analysis), in addition to minimizing aliasing. Each such filtered baseband signal is then digitized by sampling/quantization circuit 40A, digitally upconverted by multipliers 42A, using digitized sinusoids 43A-45A (or alternatively simply upsampled), and then bandpass filtered (i.e., within reconstruction filters 46-48) in order to restore the input signal to its previous frequency band (i.e., signal synthesis). Finally, the individual bands are recombined in one or more adders 49. Instead of operating at a sampling frequency equal to twice the bandwidth of the input signal, each converter 40A in the interleaved array is able to operate at a lower sampling frequency equal to twice the bandwidth of each subdivided, downcoverted band (i.e., the portion of the input signal intended to be converted by the respective processing branch).

Frequency-interleaving converter circuit 30A, illustrated in FIG. 3A, is typically referred to as a frequency-translating hybrid (FTH) architecture. See Mazlouman, S., "Digital Compensation Techniques for Frequency-Translating Hybrid Analog-to-Digital Converters", IEEE Transactions on Instrumentation and Measurement, Volume 60, Number 3, 2011. An alternative, conventional frequency-interleaving converter, first described by Petraglia and Mitra in 1990, is the hybrid filter bank (HFB) converter circuit 30B, shown in FIG. 3B. See Petraglia, A., "High Speed A/D Conversion using QMF Filter Banks", Proceedings: IEEE International Symposium on Circuits and Systems, 1990. The operation of the HFB converter is similar to that of the FTH converter, except that the input signal 31 is provided to a set of analog, bandpass filters 36B-38B (i.e., conventionally referred to as analysis filters) for spectral decomposition, before being provided to multipliers 32B for downconversion to baseband using the band's central frequencies 33B-35B. The analog input (bandpass-decomposition) filters are conventionally designed for minimum spectral overlap (i.e., non-overlapping passbands), with preferred bandwidths of $f_{CLK}/2M$, where $f_{CLK}$ is the converter sample-rate frequency and M is the number of parallel processing branches. See Velazquez, S., "Design of Hybrid Filter Banks for Analog/Digital Conversion", IEEE Transactions on Signal Processing, Volume 46, Number 4, 1998. As in the FTH approach, each converter 40B in the interleaved array of the HFB converter operates at a sampling frequency equal to twice the bandwidth of each subdivided, downcoverted band (i.e., the portion of the input signal intended to be converted by the respective processing branch). Conventionally, the FTH approach is preferred over the HFB approach because: 1) matched lowpass-decomposition filters are easier to implement than matched bandpass-decomposition filters, 2) filtering after downconversion ensures minimal spectral overlap between sub-bands; and 3) filtering prior to digitizing reduces errors due to aliasing. See Ding, G., "Frequency-Interleaving Technique for High-Speed A/D Conversion", Proceedings: IEEE International Symposium on Circuits and Systems, 2003. The present inventor has discovered, however, that since the FTH approach employs no bandlimiting prior to the downconversion operation, intermodulation distortion that is introduced by the input multipliers can degrade conversion accuracy.

A variation on the conventional hybrid filter bank (HFB) converter is the multiband delta-sigma (MBΔΣ) converter circuit 30C, shown in FIG. 3C. See Aziz, P., "Multi Band Sigma Delta Analog to Digital Conversion", IEEE International Conference on Acoustics, Speech, and Signal Processing, 1994. This approach attempts to solve the difficulties associated with implementing matched bandpass-decomposition (analysis) filters by eliminating them completely. And unlike conventional FTH and HFB converters, the MBAΔΣ converter performs no spectral (frequency) decomposition in the analog domain. The input signal 31 instead is provided directly to the sampling/quantization elements 40C, which consequently prevent aliasing errors by sampling at twice the bandwidth of the input signal, rather than at twice the bandwidth of a subdivided band. The present inventor has discovered that a primary disadvantage of MBAΔΣ approach is increased sensitivity to timing jitter, due to the presence of wideband signals at the inputs of each sampling/quantization circuit (i.e., no analog bandlimiting prior to sampling and quantization). The present inventor also has discovered that another disadvantage of frequency decomposition in the analog domain is that the practical (e.g., manufacturing) constraints associated with analog bandpass filter quality factor (i.e., quality factor Q, defined as the ratio of filter center frequency to filter bandwidth) limits the number of processing branches to about 25-30, a number which may be insufficient for realizing desired bandwidth and conversion-accuracy targets.

Although, conventionally, frequency-interleaving converters are considered to be less sensitive to timing jitter than time-interleaving converters, as a result of downconversion to baseband and use of a common sampling clock (Ding 2003), timing jitter is a problem for any converter that processes high-frequency input signals. Conventional methods for reducing timing jitter generally attempt to attenuate the short-term jitter (i.e., white phase noise) of the sampling clock source, ignoring longer-term jitter and drift. See Smilkstein, T., "Jitter Reduction on High-Speed Clock Signals" (PhD Thesis), University of California, Berkeley, 2007. These conventional methods typically involve improving the stability of the clock oscillator itself, for example using high-precision atomic or quartz resonators, or involve use of phase-locked loop (PLL) techniques (Smilkstein, 2007) to slave the frequency of a relatively stable oscillator (i.e., atomic or quartz) to the average frequency of a relatively unstable or noise-corrupted clock source.

Circuit 50, illustrated in FIG. 4A, is an exemplary PLL of the type conventionally used for reducing the high-frequency timing jitter of a sampling clock source. In circuit 50, the output phase of a clock source 52, which has been corrupted by noise, is compared to the output phase of a low-jitter, controlled oscillator 60 within phase detector 56. The phase difference 57 (i.e., phase error) between the noisy (high-jitter) clock source and the precision oscillator is lowpass filtered, by loop filter 58, to produce a control signal 59. Control signal 59 adjusts the frequency of controlled oscillator 60 to match the average frequency of noisy clock source 52. A frequency divider 62 can be included in the feedback path of the PLL such that the frequency ($f_{OSC}$) at PLL output 61 equals $f_{OSC}=D\cdot f_0$, where $f_0$ is the nominal frequency of the noisy clock source and D is the frequency-output to frequency-input ratio of the divider.

The jitter transfer function of circuit 50 is the frequency response from the output 53 of noisy oscillator 52, to the output 61 of the PLL. For a phase detector 56 with gain $K_D$, a controlled oscillator 60 with gain $K_V$, and a loop filter 58 with second-order, lag-lead response $$H(s) = \frac{1+\beta \cdot s}{\alpha \cdot s},$$

the jitter transfer function, $H_{JTF}$, has a lowpass response given by $$H_{JTF} = \frac{\omega_n^2}{1+2\zeta\omega_n + \omega_n^2},$$

where the PLL natural frequency $\omega_n = \sqrt{K_D \cdot K_V/\alpha}$ and the PLL damping factor $$\zeta = \frac{1}{2} \cdot \omega_n \cdot \beta.$$

For reference, the jitter transfer function for PLL circuit 50 is plotted in FIG. 4B. As illustrated in FIG. 4B, jitter that fluctuates at a rate greater than $\omega_n$ is attenuated by the PLL. The clock signal at the output of the PLL will be more stable than the output of noisy clock source 52, when: (1) controlled oscillator 60 has very low jitter (i.e., the output of oscillator 60 is relatively stable) and (2) $\omega_n$ is lower than the fluctuation rate (frequency) for the dominant source(s) of jitter (e.g., white frequency, flicker phase, white phase).

The conventional jitter attenuation methods, based on PLLs with high-stability controlled oscillators, can be useful for reducing the high-frequency jitter (i.e., short-term jitter) of a noise-corrupted clock source, as illustrated by the exemplary jitter transfer function in FIG. 4B. In practice, however, the present inventor has discovered that conventional, PLL-based jitter attenuation methods have several disadvantages that limit their utility in converter applications, including: (1) a tunable, high-precision oscillator generally cannot accommodate the wide range of conversion rates at which a converter typically needs to operate; (2) overall timing jitter is not reduced significantly because timing jitter tends to be dominated by low-frequency jitter as illustrated in FIG. 2B (i.e., low-frequency jitter has higher magnitude than high-frequency jitter); and (3) the cost and complexity may be prohibitive because the high-precision resonators needed to implement the controlled clock source cannot be integrated onto silicon devices using conventional methods. For these reasons, improved apparatuses and methods are needed for reducing the performance degradation caused by timing jitter, particularly in converter applications where high-frequency input signals are processed.

SUMMARY OF THE INVENTION

The present inventor has discovered improved approaches to reducing errors caused by timing uncertainty in circuits that convert linear (analog) signals into discrete (digital) signals. For example, rather than reduce sampling jitter at the clock source, apparatuses and methods according to the preferred embodiments of the present invention reduce the level of output noise introduced by sampling jitter, effectively making the converter circuits less sensitive to errors from sampling uncertainty. In particular, compared to conventional means, the jitter-mitigation approaches of the preferred embodiments of the present invention have at least two distinct advantages, namely: 1) the improved approaches are effective at mitigating performance degradation due to low-frequency jitter (e.g., drift and wander), as well as high-frequency jitter; and 2) the improved approaches do not require high-stability clock sources (e.g., oscillators with high-precision resonators) with outputs that tune over a wide frequency range, which are impractical in many applications, such as those employing integrated-circuit fabrication.

Thus, one specific embodiment of the invention is directed to an apparatus for converting a continuous-time, continuously variable signal into a sampled and quantized signal. The apparatus includes: an input line for accepting an input signal that is continuous in time and continuously variable; a plurality of processing branches coupled to the input line; and an adder coupled to outputs of the plurality of processing branches. Each of the processing branches includes: (a) an analog bandpass filter, (b) a sampling/quantization circuit coupled to an output of the analog bandpass filter, and (c) a digital bandpass filter coupled to an output of the sampling/quantization circuit. The digital bandpass filters in different ones of the plurality of processing branches have frequency response bandwidths that are centered at different frequencies, and the analog bandpass filters in different ones of the plurality of processing branches have frequency responses with bandwidths that are at least 25% greater than the frequency response bandwidths of the digital bandpass filters in their respective processing branches.

Preferably, the bandwidth of the digital filter determines the portion (i.e., sub-band) of the input signal spectrum that is converted by the associated processing branch, with the bandwidth of each digital filter being selected to produce minimal spectral overlap with the digital bandpass filters of the other processing branches. Unlike conventional HFB frequency-interleaving converters, the bandwidth of each analog bandpass filter preferably spans multiple converter sub-bands (or at least significantly more than one sub-band), with the bandwidth of each analog filter preferably being intentionally selected to produce appreciable spectral overlap with the analog bandpass filters of the other processing branches, so that the analog bandpass filters do not perform a frequency decomposition function. Compared to conventional converters, the foregoing converter generally can reduce the amount of output noise that is introduced by timing uncertainty, particularly for narrowband input signals having high-frequency content, using standard analog filter responses.

A second specific embodiment of the invention is directed to an apparatus for converting a continuous-time, continuously variable signal into a sampled and quantized signal. The apparatus includes: an input line for accepting an input signal that is continuous in time and continuously variable; a plurality of processing branches coupled to the input line; a plurality of first adders, each combining outputs of at least two of the processing branches; a plurality of resampling interpolators, each coupled to an output of one of the first adders; and a second adder coupled to outputs of the plurality of resampling interpolators. Each of the processing branches includes: (a) a sampling/quantization circuit; and (b) a digital bandpass filter coupled to an output of the sampling/quantization circuit. The digital bandpass filters in different ones of the plurality of processing branches have frequency responses that are centered at different frequencies, and the rate at which at least one of the sampling/quantization circuits operates is different than an overall output data rate of said apparatus. Each of the resampling interpolators converts a first signal sample rate used by the sampling/quantization circuits in at least one of its corresponding processing branches to a second signal sample rate that is different than the first signal sample rate.

The foregoing structure permits decoupling of the sample-rate clock source from the conversion-rate clock source. Decoupling the sample-rate and conversion-rate clock sources enables a wide range of conversion rates to be supported using: (1) a high-precision, fixed-frequency clock source for sampling; or (2) a sample-rate clock source with an output frequency that is tunable over a limited range. The bandwidth of the digital filter again preferably determines the portion (i.e., sub-band) of the input signal spectrum that is converted by the associated processing branch, with the bandwidth of each digital filter preferably being selected to produce minimal spectral overlap with the digital bandpass filters of the other processing branches. The resampling interpolator converts a signal at its input, which has been sampled at a rate preferably determined by a precision clock source (i.e., the sample-rate frequency of the converter), to a signal at its output that has been sampled at a rate preferably determined by an independent data clock source (i.e., the conversion-rate frequency of the converter). Resampling in the digital domain allows the conversion-rate frequency of the converter to be independent of the sample-rate frequency of the converter.

Variations on the foregoing embodiment include a means for correcting errors caused by timing jitter. The preferred apparatus includes a sampling error detector having an output coupled to at least one of the resampling interpolators. The sampling error detector preferably outputs a control signal that: (1) tracks the frequency fluctuations at the output of sampling clock source, and (2) provides the resampling interpolator with information needed to resample the digital bandpass filter output in a manner that corrects for errors due to sampling uncertainty. More preferably, the output of the sampling error detector is a function of (e.g., proportional to) a difference between a rate at which at least one of the sampling/quantization circuits operates and a desired rate.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

DESCRIPTION OF THE PREFERRED EMBODIMENT(S)

Figure 1:
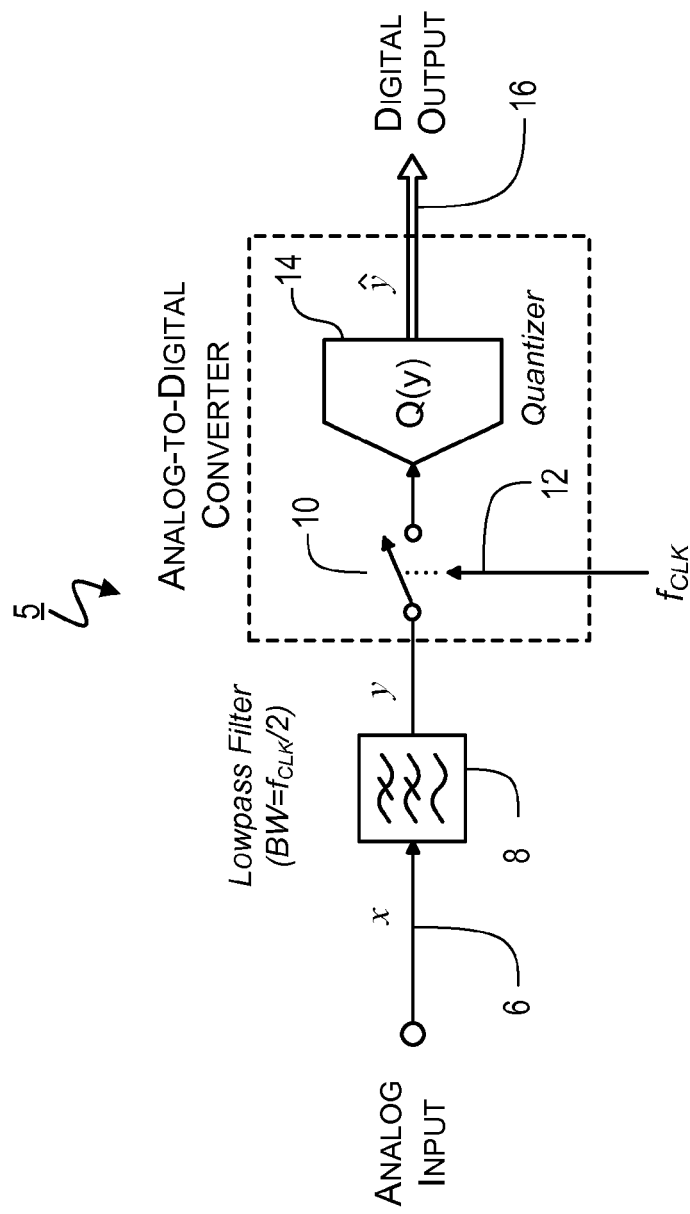
FIG. 1 is a block diagram of a conventional circuit that converts a continuous-time, continuously variable input signal into a discrete-time, discretely variable signal using a lowpass (anti-aliasing) filter, a sampler, and a quantizer.
Figure 2A:
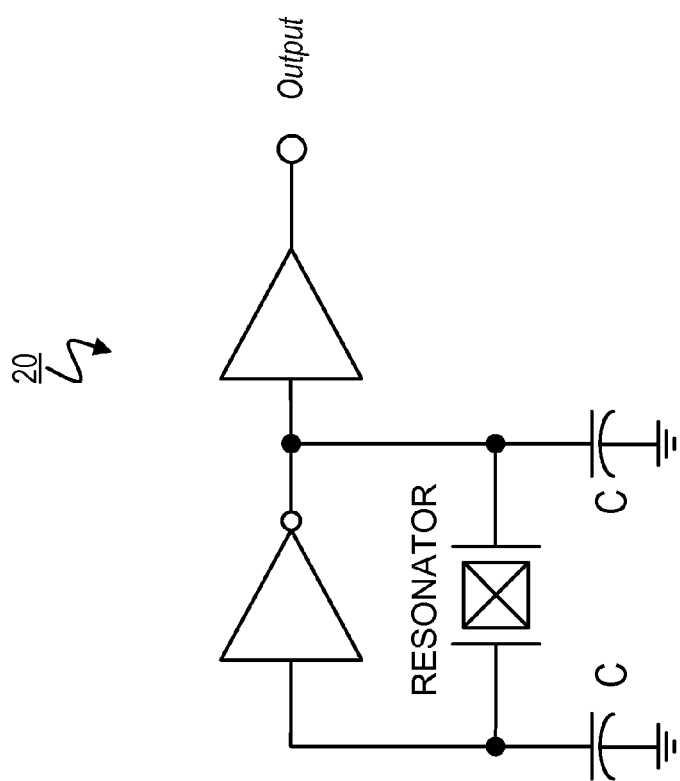
FIG. 2A is a block diagram of an exemplary, conventional oscillator that incorporates a network which resonates at a particular frequency.
Figure 2B:
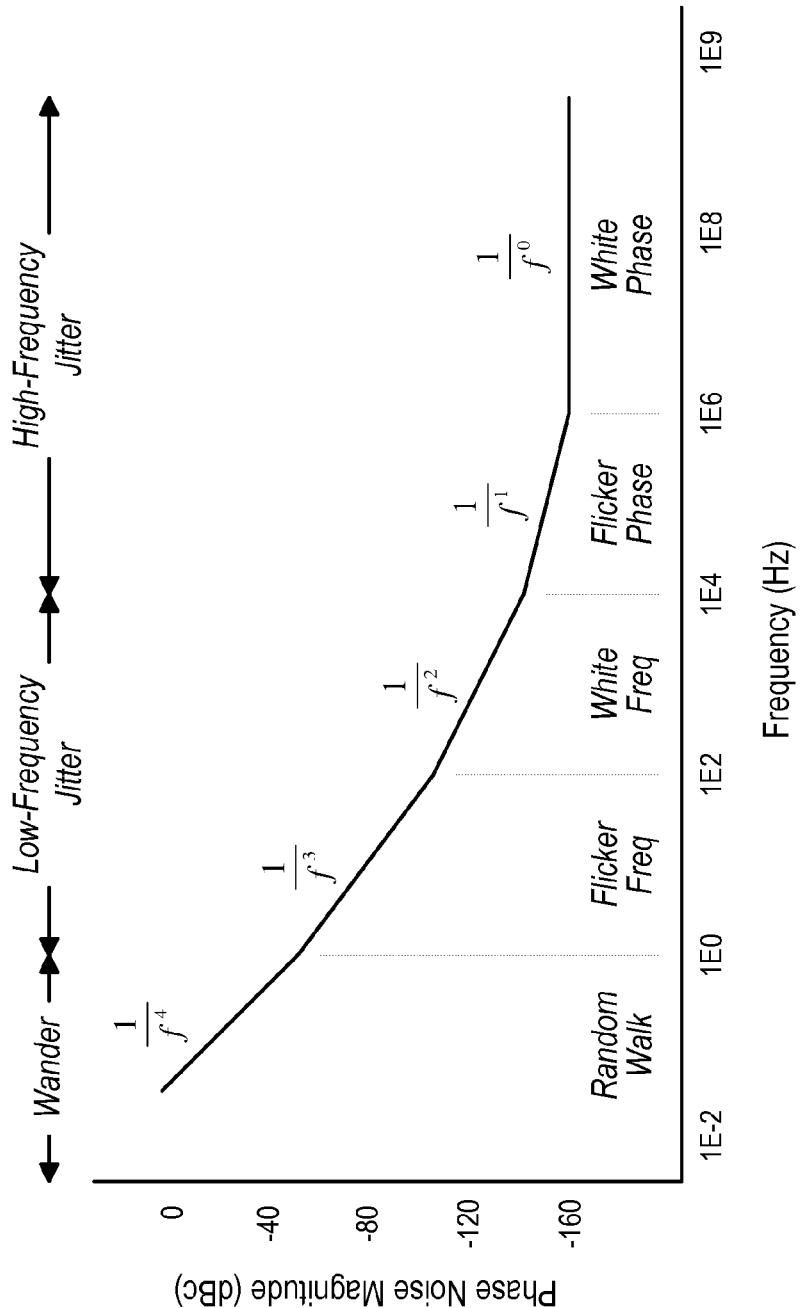
FIG. 2B is a diagram illustrating the output jitter profile of a conventional oscillator with respect to jitter magnitude in dBc (y-axis) versus jitter fluctuation rate in hertz (x-axis).
Figure 3A:
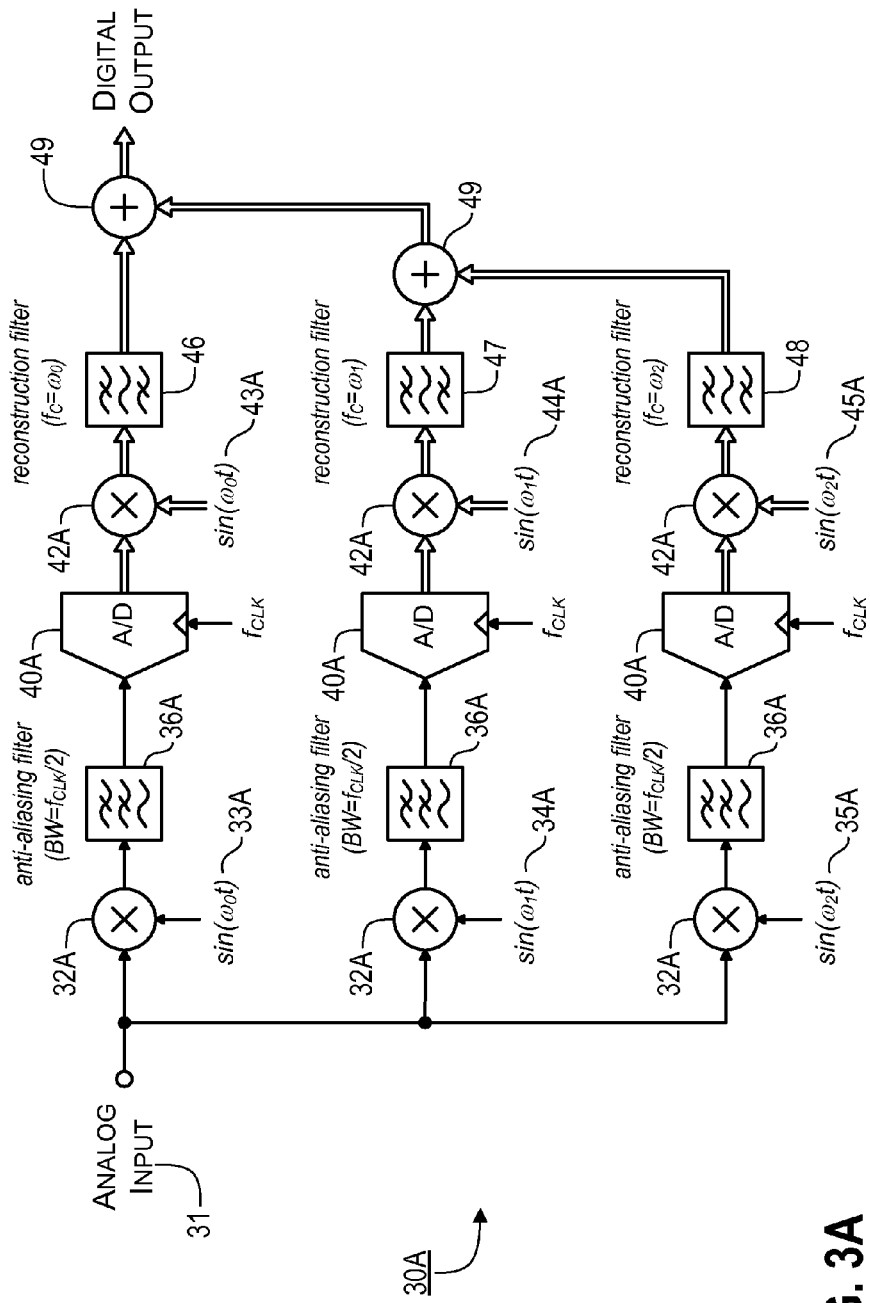
FIG. 3A is a block diagram of a conventional frequency-interleaving converter that is sometimes referred to as a frequency-translating hybrid (FTH) converter.
Figure 3B:
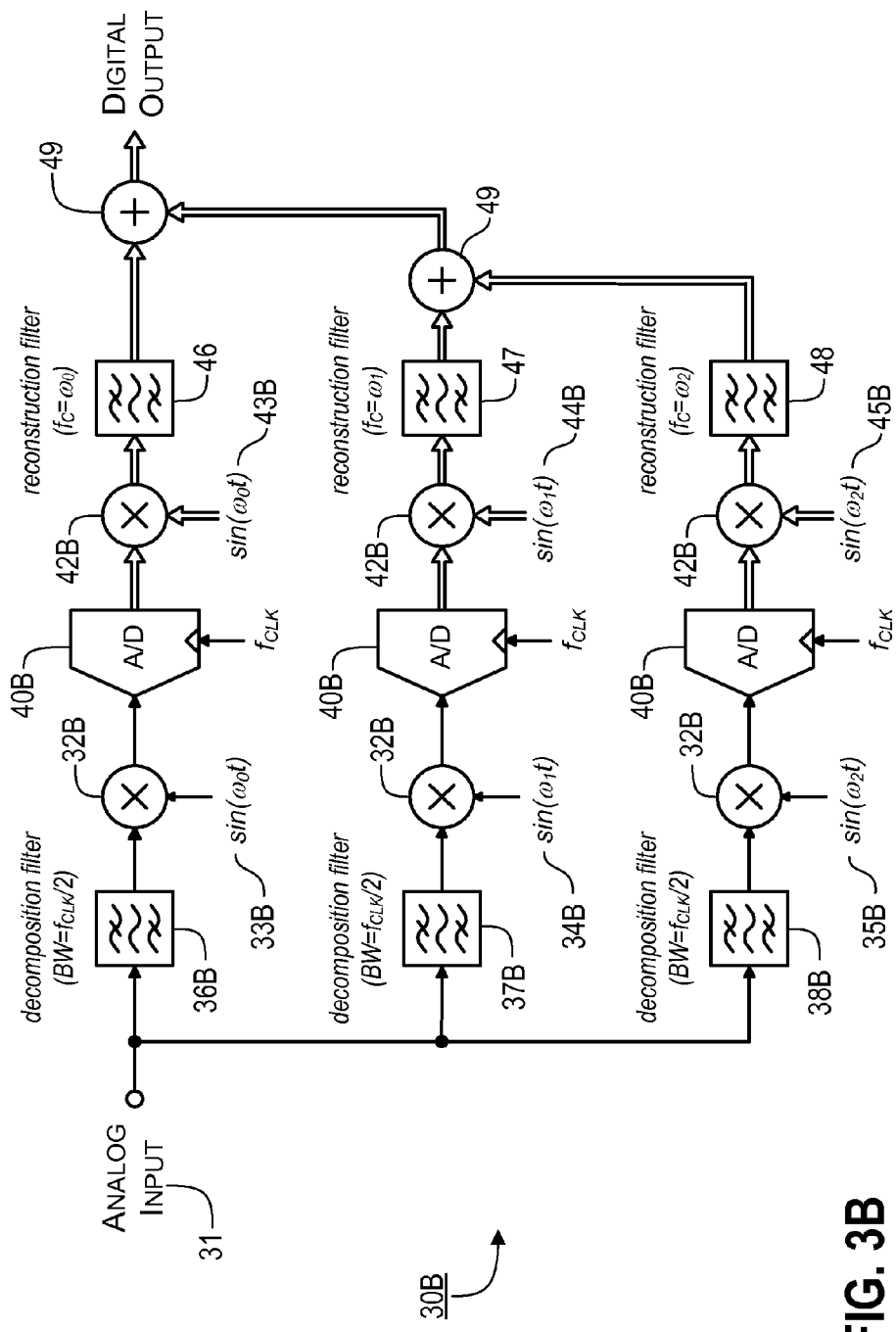
FIG. 3B is a block diagram of a conventional frequency-interleaving converter that is sometimes referred to as a hybrid filter bank (HFB) converter.
Figure 3C:
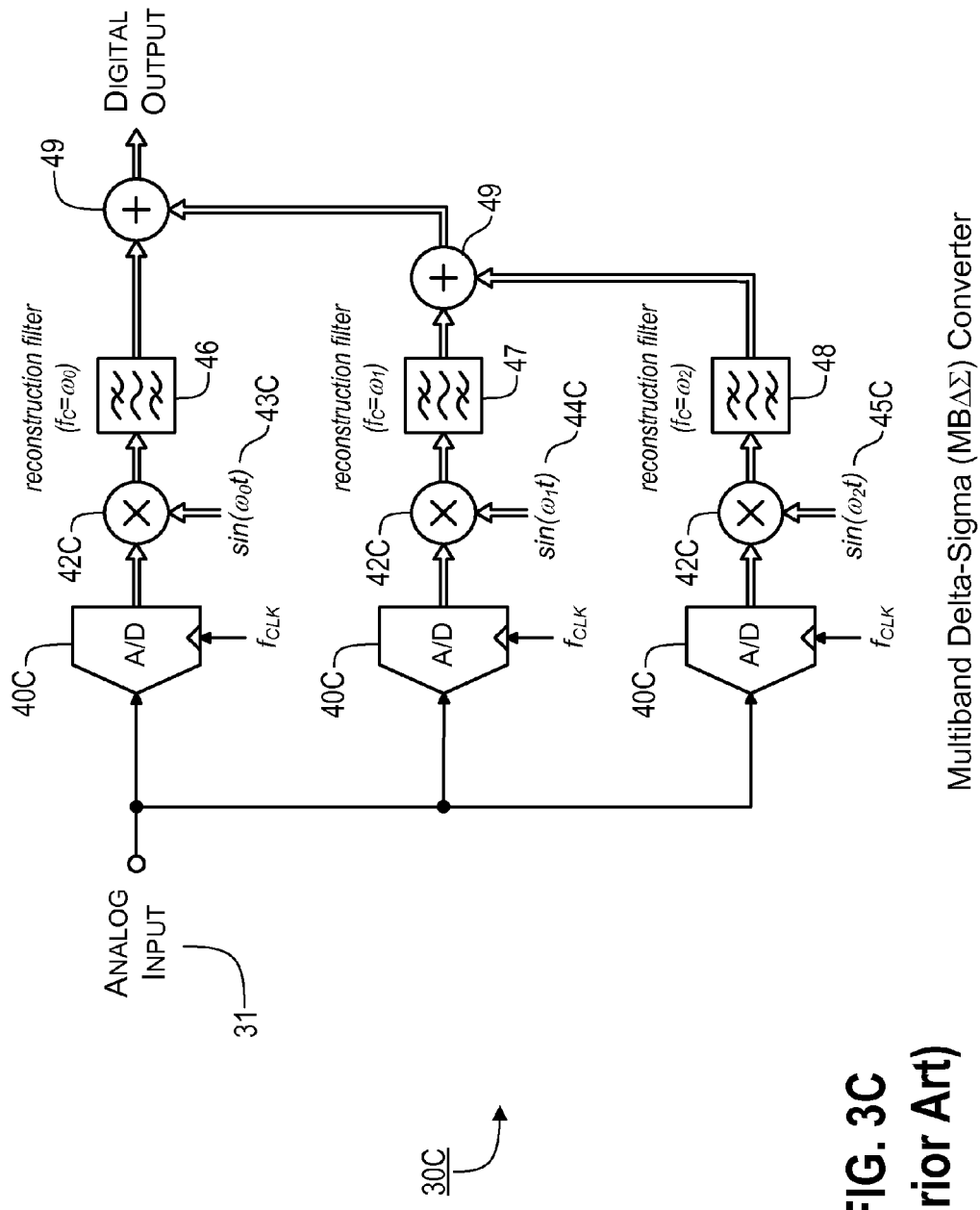
FIG. 3C is a block diagram of a conventional frequency-interleaving converter that is sometimes referred to as a multiband delta-sigma (MBAΔΣ) converter.
Figure 4A:
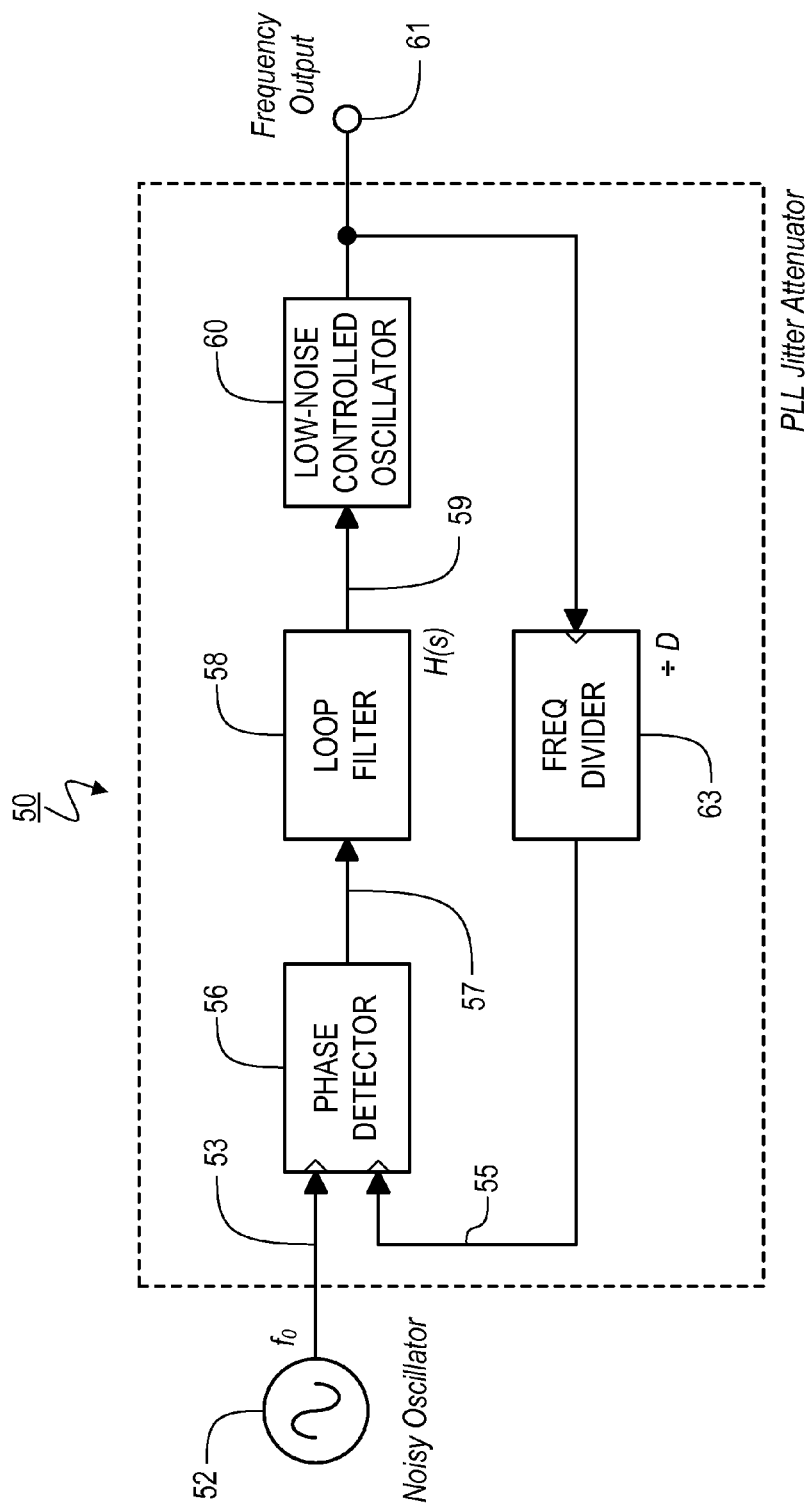
FIG. 4A is a block diagram of a conventional jitter attenuator circuit that incorporates a phase-lock loop having a phase detector, a loop filter, a controlled oscillator, and a frequency divider.
Figure 4B:
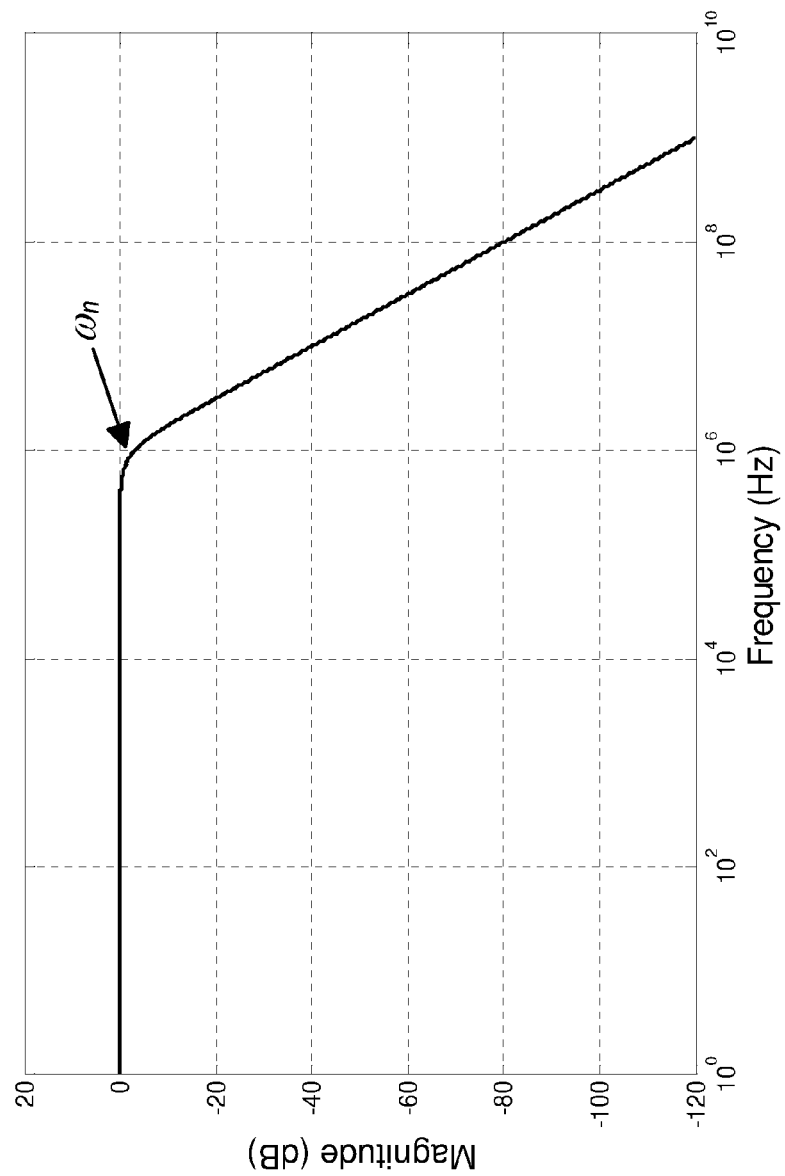
FIG. 4B is a plot of the jitter transfer function of a conventional jitter attenuator circuit with respect to jitter attenuation in dB (y-axis) versus jitter fluctuation rate in hertz (x-axis).

The present disclosure is related in part to the disclosures set forth in U.S. Provisional Patent Application Ser. No. 61/501,284 (the '284 Application), filed on Jun. 27, 2011; U.S. Provisional Patent Application Ser. No. 61/439,733, filed on Feb. 4, 2011; U.S. patent application Ser. No. 12/985,238, filed on May 1, 2011; and U.S. patent application Ser. No. 12/824,171, filed on Jun. 26, 2010, all by the present inventor, and all titled "Sampling/Quantization Converters". The foregoing applications are incorporated by reference herein as though set forth herein in full.

A preferred converter, which according to the present invention incorporates methods for reducing conversion errors caused by sampling uncertainty/jitter, is sometimes is referred to herein as being jitter-tolerant. A jitter-tolerant converter, according to the preferred embodiments of the present invention, employs parallel processing with frequency-decomposition (i.e., slicing), and therefore shares some structural similarities with conventional frequency-interleaving converters, such as the FTC, HFB, and MBΔΣ converters described above. However, a jitter-tolerant converter according to the preferred embodiments of the present invention incorporates one or more distinct technological innovations to provide implementation and/or performance advantages compared to conventional approaches, such as: (1) conversion errors due to sampling uncertainty are reduced because the converter input signal is bandlimited by analog (i.e., continuous-time) filters prior to sampling and quantization (e.g., compared to MBΔΣ); (2) the complexity of the analog input filters is reduced because the bandwidth of the filters is appreciably wider than the portion of the input signal spectrum that is converted by the associated processing branch (e.g., compared to FTH and HFB); (3) conversion accuracy is relatively insensitive to the analog input filter responses because the passbands associated with the analog input filters of the various processing branches can be set to overlap significantly and arbitrarily (e.g., compared to FTH and HFB), allowing use of analog filters with standard frequency responses (e.g., Butterworth, Chebychev, Bessel or elliptic); (4) high-precision, fixed-frequency sample clock sources can be employed because resampling in the digital domain allows the converter conversion-rate frequency (i.e., the output data rate) to be independent of the converter sample-rate frequency (e.g., compared to FTH, HFB, and MBΔΣ); and (5) higher levels of sampling uncertainty can be tolerated because errors introduced by sampling uncertainty are corrected by resampling in the digital domain (e.g., compared to FTH, HFB, and MBΔΣ). At least some of such approaches can in some respects be thought of as using a unique and novel combination of several conventional techniques—frequency interleaving, digital resampling (interpolation), and bandpass filtering. As discussed in more detail below, the use of such approaches often can overcome the problems associated with sampling uncertainty in converters that process high-frequency input signals.

Figure 5A:
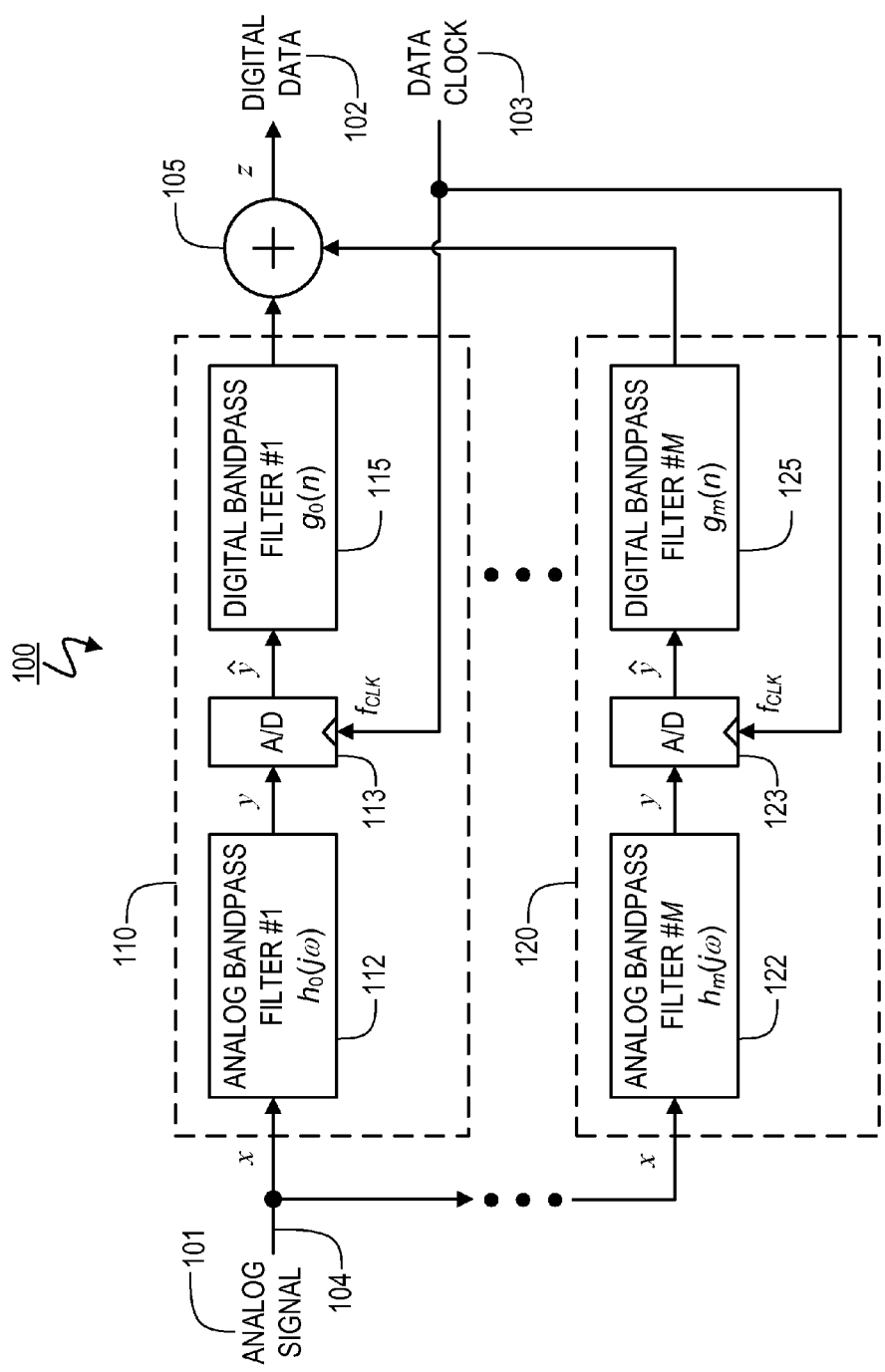
FIG. 5A is a simplified block diagram of a converter according to one representative embodiment of the present invention that incorporates analog bandpass filters to reduce the amount of output noise introduced by sampling uncertainty (jitter)
Figure 5B:
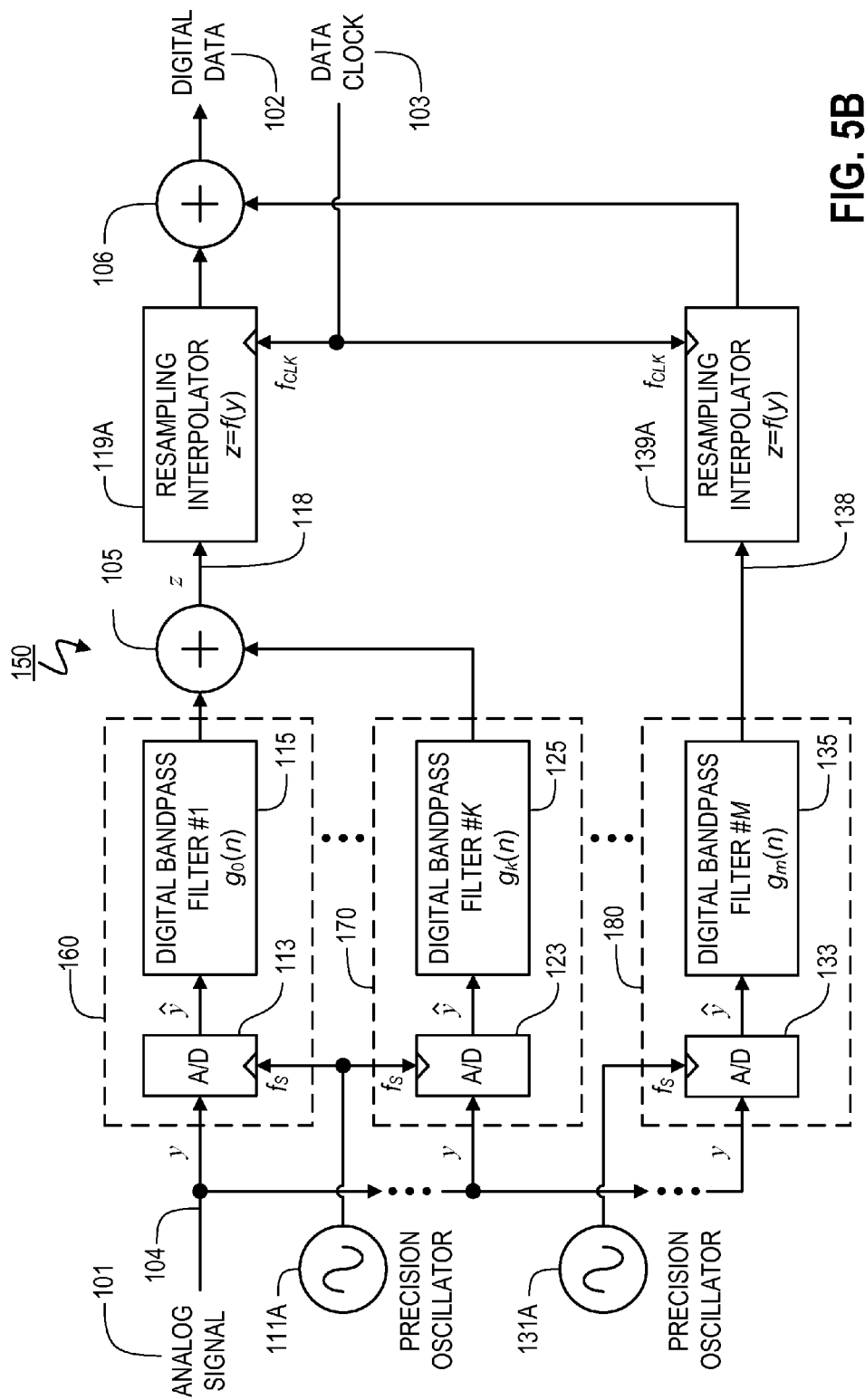
FIG. 5B is a simplified block diagram of a converter according to a second representative embodiment of the present invention that incorporates a digital resampling function so that a wide range of conversion rates can be realized with a fixed-frequency, high-precision sampling clock.
Figure 5C:
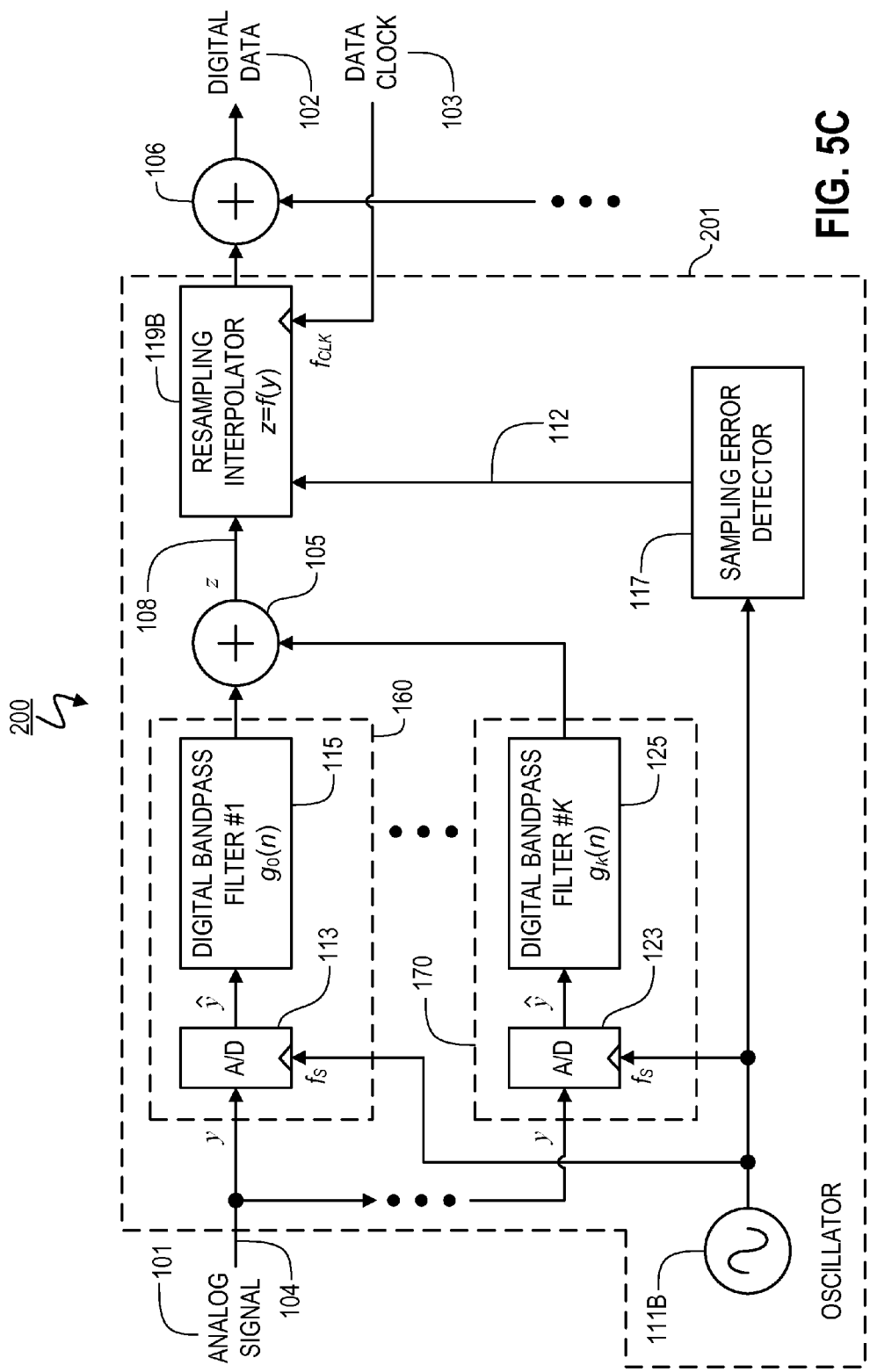
FIG. 5C is a simplified block diagram of a converter according to a third representative embodiment of the present invention that corrects for sampling errors using digital resampling.

Simplified block diagrams of converters 100, 150, and 200 according to certain preferred embodiments of the present invention are illustrated in FIGS. 5A-C, respectively. In the preferred embodiments, converters 100, 150, and 200 separately process M different frequency bands for a continuous-time, continuously variable signal 101, using a separate branch (e.g., branch 110, 120, 160, 170 or 180) to process each such band, and then sum up some or all of the branch outputs in an adder 105 in the course of providing the output digital signal 102. More specifically, the signal 101 is input on a line 104 that could be implemented, e.g., as a physical port for accepting an external signal or as an internal wire, conductive trace or a similar conductive path for receiving a signal from another circuit within the same device. In the present embodiment, the input signal 101 is provided directly to each of the branches (e.g., branches 110 and 120 or branches 160, 170 and 180). However, in alternate embodiments the input line 104 can be coupled to such branches in any other manner. As used herein, the term "coupled", or any other form of the word, is intended to mean either directly connected or connected through one or more other processing blocks, e.g., for the purpose of preprocessing. It should also be noted that any number of branches may be used.

In any event, in the present embodiments each such branch (e.g., branch 110, 120, 160, 170 or 180) primarily processes a different frequency band, and includes: (1) a sampling/quantization circuit (e.g., circuit 113 or 123); and (2) a digital reconstruction bandpass filter (e.g., bandpass filter 115 or 125). In addition, each of converters 100, 150, and 200 also includes at least one of: (1) an analog input (bandpass) filter; (2) a resampling interpolator; and (3) a sampling error detector. The digital reconstruction filter (e.g., bandpass filter 115 or 125) performs a frequency-decomposition function, such that the center frequency and bandwidth of each digital filter determines which portion of the input signal spectrum (i.e., sub-band) is converted by its associated processing branch (e.g., branch 110, 120, 160, 170 or 180). Therefore, the center frequency of the digital bandpass filter is preferably aligned with the center of the sub-band to be retrieved from the respective processing branch. Preferably, the passband of each digital bandpass filter does not significantly overlap with the passband of any of the other digital bandpass filters. More preferably: (1) the center frequency of each digital bandpass filter is equal to the center frequency of the desired sub-band; and (2) the passbands of the various digital bandpass filters overlap in a precisely minimal manner to form, what is referred to in the prior art as, a near-perfect, signal-reconstruction filter bank.

In the preferred embodiments of the present invention, the digital bandpass filters form a near-perfect, signal-reconstruction filter bank so that the signal reconstruction process introduces negligible amplitude and group delay distortion at the converter output. Specifically, minimum amplitude and group delay distortion occurs when the overall digital filter bank response is all-pass. The overall response of the digital filters is all-pass when, for $g_k(n)$ being the impulse response of the digital bandpass filter in the $k^{th}$ processing branch, $$\sum_{k=0}^{M-1} g_k(n) = a \cdot z^{-b},$$

where a and b are constants, such that $$\sum_{k=0}^{M-1} |g_k(n)|^2 = \sum_{k=0}^{M-1} |g_k(e^{j\omega})|^2 \approx 1$$

over the converter passband (i.e.

$$\Omega_B = \frac{1}{2} \cdot f_S,$$

where $f_S$ is the converter sample frequency). Furthermore, the bandwidths of the digital reconstruction filters in all of the processing branches are equal in the preferred embodiments, such that the converter sub-bands are uniformly spaced across the Nyquist bandwidth $\Omega_B$ of the converter. Therefore, for a signal-reconstruction filter bank comprised of M filters, each digital filter preferably has a noise bandwidth of $$B_N = \frac{1}{2\pi} \int_{-\infty}^{+\infty} |g_k(e^{j\omega})|^2 d\omega \approx \frac{\Omega_B}{N \cdot M},$$

where N is the excess-rate oversampling ratio of the converter given by $$N = \frac{1}{2} \cdot f_S / \Omega_B.$$

However, in alternative embodiments the converter sub-bands are non-uniformly spaced and the noise bandwidths of the digital reconstruction filters in each of the processing branches are not equal.

Embodiments Employing an Analog Input (Bandpass) Filter

A first representative embodiment of the present invention is the jitter-tolerant converter circuit 100, illustrated in FIG. 5A. Converter circuit 100 is comprised of M processing branches (e.g., branches 110 and 120), each of which including an analog input filter (e.g., bandpass filter 112 or 122), in addition to a sampling/quantization circuit (e.g., circuit 113 or 123) and a digital reconstruction filter (e.g., bandpass filter 115 or 125). In the preferred embodiments, the center frequency of the analog input filter is aligned with the center frequency of the digital reconstruction filter within the same processing branch. However, the bandwidth of the analog input filter is preferably wider than the bandwidth of the digital reconstruction filter (when using a consistent criterion for determining such bandwidths, such as the −3 dB points) by an appreciable amount, such as by a factor of at least 1.25, 1.5, 2, 2.5 or more. When the passbands of the digital reconstruction filters are minimally overlapped (as in the preferred embodiments), the passbands of the analog input filters necessarily overlap (e.g., by as much as 50% or more) due to their appreciably wider bandwidth.

It should be noted that since the bandwidth of the analog filter exceeds the bandwidth of the digital frequency-decomposition filter, the sample-rate frequency of the sampling/quantization circuits (e.g., circuits 113 and 123) in the preferred embodiments is greater than twice the bandwidth of the sub-band intended to be converted by a given processing branch (i.e., the sampling/quantization circuits oversample the signal at their inputs). Therefore, the analog bandpass filters do not perform a conventional anti-aliasing function (i.e., the analog filters do not perform the same anti-aliasing function as in FTH converters, where processing branch inputs are bandlimited to the bandwidth of the associated sub-band). It should be noted further that, due to overlapping bandwidths, the analog bandpass filters in the preferred embodiments do not perform a conventional frequency-decomposition (i.e., signal analysis) function in the sense that the bandwidths of the analog filters (e.g., filters 112 and 122) do not define the converter sub-bands, as in FTH and HFB converters. Instead an appreciably wider (preferably by a factor of 1.25, 1.5, 2, 2.5 or more) analog filter bandwidth, relative to the bandwidth of the digital filters (e.g., filters 115 and 125), ensures that: (1) the interaction between the analog bandpass filters and the digital bandpass filters is weak; and (2) the near-perfect signal reconstruction (i.e., signal synthesis) and frequency-decomposition (i.e., signal analysis) properties of the digital filter bank are not significantly affected by the presence of the analog input filters. Therefore, since the analog input filters are not integral to the frequency-decomposition function, the analog filters preferably have standard responses, such as Butterworth, Chebychev, Bessel or elliptic responses, that can be realized via passive means (e.g., LC lattice, coupled resonator, distributed element, etc.) or active means (e.g., Sallen-Key, cascaded integrator, voltage-controlled voltage-source, etc.). To minimize potential degradation to the signal reconstruction process performed by the digital bandpass filters, the analog bandpass filters in each of the processing branches preferably have matched insertion loss and matched propagation delay over the portion of the analog filter passband that coincides with the total passband of each converter sub-band. Insertion loss and propagation delay matching can be realized using conventional attenuators and delay elements, respectively.

Although as described above, the analog input filters do not perform conventional anti-aliasing or frequency-decomposition functions in the preferred embodiments of the present invention, the analog input filters (e.g., filters 112 and 122) enable the representative converter circuit 100, shown in FIG. 5A, to be more tolerant of sampling jitter than conventional converters that do not employ frequency slicing in the analog domain. Specifically, the analog input filters reduce the amount of output noise caused by sampling uncertainty for the case where the input signal does not completely occupy the Nyquist (instantaneous) bandwidth $\Omega_B$ of the converter. To demonstrate the improved jitter tolerance of circuit 100, shown in FIG. 5A, it is convenient to consider a bank of K analog input filters (e.g., filters 112 and 122) with frequency response $$H_k(j\omega) = \begin{cases} 1, & \omega_{k-1} < \omega_k < w_{k+1} \\ 0, & \text{otherwise,} \end{cases}$$

where $H_k(j\omega)$ corresponds to the frequency response of the analog input filter with impulse response $h_k(t)$, and $\omega_k$ is the center frequency of the $k^{th}$ processing branch such that $\omega_{k+1} - \omega_{k-1} \gg B_N$. Although "brick wall" filters of this type are not physically realizable, a description of the circuit in this context is sufficient to allow those skilled in the art to comprehend the operation of circuit 100 with standard filter responses. Assuming infinite converter resolution (i.e., number of rounding levels $Q \to \infty$) and a sinusoidal input signal $x(t) = A_m \cdot \sin(\omega_m t + \phi_m)$, with arbitrary amplitude $A_m$, arbitrary phase $\phi_m$, and arbitrary angular frequency $\omega_m$, the output of each analog input filter $y_k$ is $$y_k(t) = \begin{cases} A_k \cdot \sin(\omega_k t + \phi_k), & k = m \\ 0, & \text{otherwise.} \end{cases}$$

The sampled sequence at the output of each converter $\hat{y}_k$ is given by $$y_k(n) = \begin{cases} A_k \cdot \sin(\omega_k T \cdot n + \phi_k + \omega_k \cdot \varphi), & k = m \\ 0, & \text{otherwise,} \end{cases}$$

where the sampling interval $T = 1/f_S$ and $\phi$ is a white, Gaussian noise sequence produced by sampling jitter (uncertainty) having power $\sigma_\phi^2$ and power spectral density $N_0$ (i.e., $N_0 = \sigma_\phi^2/\Omega_B$). The output samples z of the converter are $$z(n) = \sum_{k=0}^{M-1} [A_m \cdot \sin(\omega_m T \cdot n + \phi_m + \omega_m \cdot \varphi)] * g_k(n),$$

where the "*" operator represents linear convolution according to $u(t)*v(t) = \int u(t-\tau) \cdot v(\tau) d\tau$. For the case where $|\phi| \ll 1$, $z(n) = A_m \cdot \sin(\omega_m T \cdot n + \phi_m) + [A_m \cdot \cos(\omega_m T \cdot n + \phi_m) \cdot (\omega_m \cdot \phi)] * g_m(n)$, resulting in an overall noise power at the converter output equal to $$P_{Noise} = \frac{1}{2} \cdot B_N \cdot N_0 \cdot A_m^2 \cdot \omega_m^2 = \frac{1}{M} \cdot \left( \frac{1}{2} \cdot \sigma_\varphi^2 \cdot A_m^2 \cdot \omega_m^2 \right),$$

which is a factor of 1/M times lower than the noise level at the output of a conventional converter that does not employ interleaving in frequency with analog bandpass filtering. In general, the lower output noise level improves converter resolution by $10 \cdot \log_{10}(1/M)/6$ bits for a sinusoidal input.

For a jitter-tolerant converter according to the representative embodiment of circuit 100, sampling time uncertainty generally introduces less noise into the converter output by an amount that depends on both the bandwidth ($\Omega_S$) of the input signal and the noise bandwidth $B'_N$ of the analog input filters. It can be shown that for $\Omega_S < B'_N$, the noise power caused by timing jitter is reduced by a factor of $\Omega_B/B'_N$ at the converter output, compared to a conventional converter that does not combine interleaving in frequency with analog bandpass filtering. Conversely, for $\Omega_S \approx \Omega_B$ (i.e., the input signal occupies nearly the entire Nyquist bandwidth of the converter), the converter output noise caused by sampling jitter is reduced by a negligible amount. For example, representing a broadband input signal as the sum of M sinusoids, such that $$x(t) = \sum_{k=0}^{M-1} A_k \cdot \sin(\omega_k t + \phi_k),$$

results in analog input filter outputs of $$y_k(t) = h_k(t) * A_k \cdot \sin(\omega_k t + \phi_k)$$
$$= A_k \cdot \sin(\omega_k t + \phi_k)$$

and sampled output sequences $\hat{y}_k$ given by $$\hat{y}_k(n) = A_k \sin(\Omega_k T \cdot n + \phi_k + \omega_k \cdot \phi).$$

For $|\phi| \ll 1$, the output samples z of the converter are $$z(n) = \sum_{k=0}^{M-1} [A_k \cdot \sin(\omega_k T \cdot n + \phi_k + \omega_k \cdot \varphi)] * g_k(n)$$
$$= \sum_{k=0}^{M-1} A_k \cdot \sin(\omega_k T \cdot n + \phi_k) +$$
$$\sum_{k=0}^{M-1} [A_k \cdot \sin(\omega_k T \cdot n + \phi_k) \cdot (\omega_k \cdot \varphi)] * g_k(n)$$

and the output noise power is $$P_{Noise} = \frac{1}{2} \cdot E\{A_k^2\} \cdot \sigma_\varphi^2 \cdot \sum_{k=0}^{M-1} \omega_k^2,$$

which is the same as that for a conventional converter. Compared to a conventional converter without frequency interleaving and analog bandpass filtering, therefore, circuit 100 exhibits better jitter tolerance for narrowband input signals, and comparable jitter tolerance for wideband input signals.

As shown in FIG. 5A, in the present embodiment each of the sampling/quantization circuits (e.g., circuits 113 and 123) samples at the same rate, i.e., the rate established by the overall converter data clock 103. However, as discussed in greater detail below, in alternate embodiments different sampling/quantization circuits can sample at different rates.

Embodiments Employing at Least One Resampling Interpolator

A second representative embodiment of a jitter-tolerant converter, according to the present invention, is circuit 150 illustrated in FIG. 5B. Each of the M processing branches (e.g., branch 160, 170 or 180) of converter circuit 150 includes a sampling/quantization circuit (e.g., circuit 113, 123 or 133) and a digital reconstruction filter (e.g., bandpass filter 115, 125 or 135). In the present embodiment, the outputs of branches 160 and 170 are combined in adder 105. In addition, circuit 150 includes: (1) precision, sample-rate clock sources (e.g., oscillators 111A, 121A and 131A) that are independent of (potentially providing different sample rates than) the conversion-rate (data) clock source 103; and (2) preferably plural resampling interpolators (e.g., circuits 119A and 139A), each being coupled to the single or combined (e.g., via adder 105) output(s) of $K_j$ processing branches, where each $K_j \leq M$. As shown, in the current embodiment the sampling rate of the sampling/quantization circuits 113 and 123 is determined by sample-rate clock source 111A, and the outputs of the corresponding branches 160 and 170 are summed (in adder 105, potentially with outputs from other branches) and provided to resampling interpolator 119A, while the sampling rate of the sampling/quantization circuit 133 is determined by sample-rate clock source 131A, and the output of the corresponding single branch 180 is provided to resampling interpolator 139A. Generally speaking, the outputs from any number of processing branches may be processed by a single resampling interpolator (although, as indicated above and discussed in greater detail below, each resampling interpolator preferably processes fewer than all of the M total processing branches), and the sample rates can be the same or can be different in different branches that use different resampling interpolators. In the preferred embodiments, the outputs of processing branches that share a common resampling interpolator are first combined (e.g., via adder 105), then provided to the common resampling interpolator, and finally combined with the output(s) of other resampling interpolators via output adder 106.

The sample-rate clock sources (e.g., 111A, 121A and 131A) are preferably precision, fixed-frequency oscillators, having a design that emphasizes stable, low jitter operation over the capability for tuning over a wide range of output frequencies. More preferably, each such sample-rate clock source is the low jitter oscillator circuit described in the '003 Application. The digital bandpass filter in each processing branch operates at the sample-rate frequency for the corresponding processing branch, which preferably is greater than or equal to the conversion-rate frequency (i.e., the frequency of data clock input 103) of the converter. In the representative embodiment of circuit 150, the resampling interpolators 119A and 139A preferably "resample" their corresponding input signals 118 (i.e., the combined output of adder 105) and 138 (the output of single bandpass filter 135), respectively, to compensate for the difference between the corresponding sample-rate frequency or frequencies ($f_S$) and the desired conversion-rate frequency ($f_{CLK}$). In other representative embodiments, however, the resampling interpolator(s) also compensate for the effects of sampling errors, approximating a condition of perfect sampling (as discussed in more detail in the Embodiments Also Employing At Least One Sampling Error Detector section below).

In addition to providing a frequency-decomposition function, the digital bandpass filters in the preferred embodiments perform a bandlimiting function that is integral to the resampling operation. For sufficient bandlimiting, the relationship between a sampled output value at one sample-time instant and a sampled output value at an offset sample-time instant (i.e., offset between sample-time interval $1/f_S$ and conversion-time interval $1/f_{CLK}$) is well approximated, over a sample-time interval, by a linear or parabolic function. Specifically, the accuracy of the parabolic approximation depends on: (1) the total number of processing branches M; (2) the excess-rate oversampling ratio N (defined above); and (3) the number of processing branches $K_j$ associated with the $j^{th}$ resampling interpolator (i.e., the $j^{th}$ resampling interpolator is coupled to the combined output of $K_j$ of the M processing branches). More specifically, for a combined digital filter output with noise bandwidth $K_j \cdot B_N \approx \Omega_B \cdot K_j/(N \cdot M)$, the accuracy of the parabolic approximation improves logarithmically according to the ratio $K_j/(N \cdot M)$, such that for every factor of two decrease in the ratio $K_j/(N \cdot M)$, the accuracy ($\epsilon$) of the approximation improves by a factor of about 4, or $$\varepsilon \approx \frac{k}{4 \cdot \log_2\left(\frac{K}{N \cdot M}\right)}.$$

In the preferred embodiments, digital resampling is based on a parabolic interpolation with a ratio $$K_j/(N \cdot M) \leq \frac{1}{6}$$

accuracy of at least 0.5% (i.e., 7.5 effective bits). More preferably, digital resampling is based on a parabolic interpolation with a ratio $$K_j/(N \cdot M) \leq \frac{1}{16}$$

to ensure a resampling accuracy of better than 0.1% (i.e., 10 effective bits). In alternate embodiments, however, digital resampling can be based on linear or nonlinear (e.g., sinusoidal or cubic spline) interpolation between sampled output values, and a different $K_j/(N \cdot M)$ ratio.

Figure 6A:
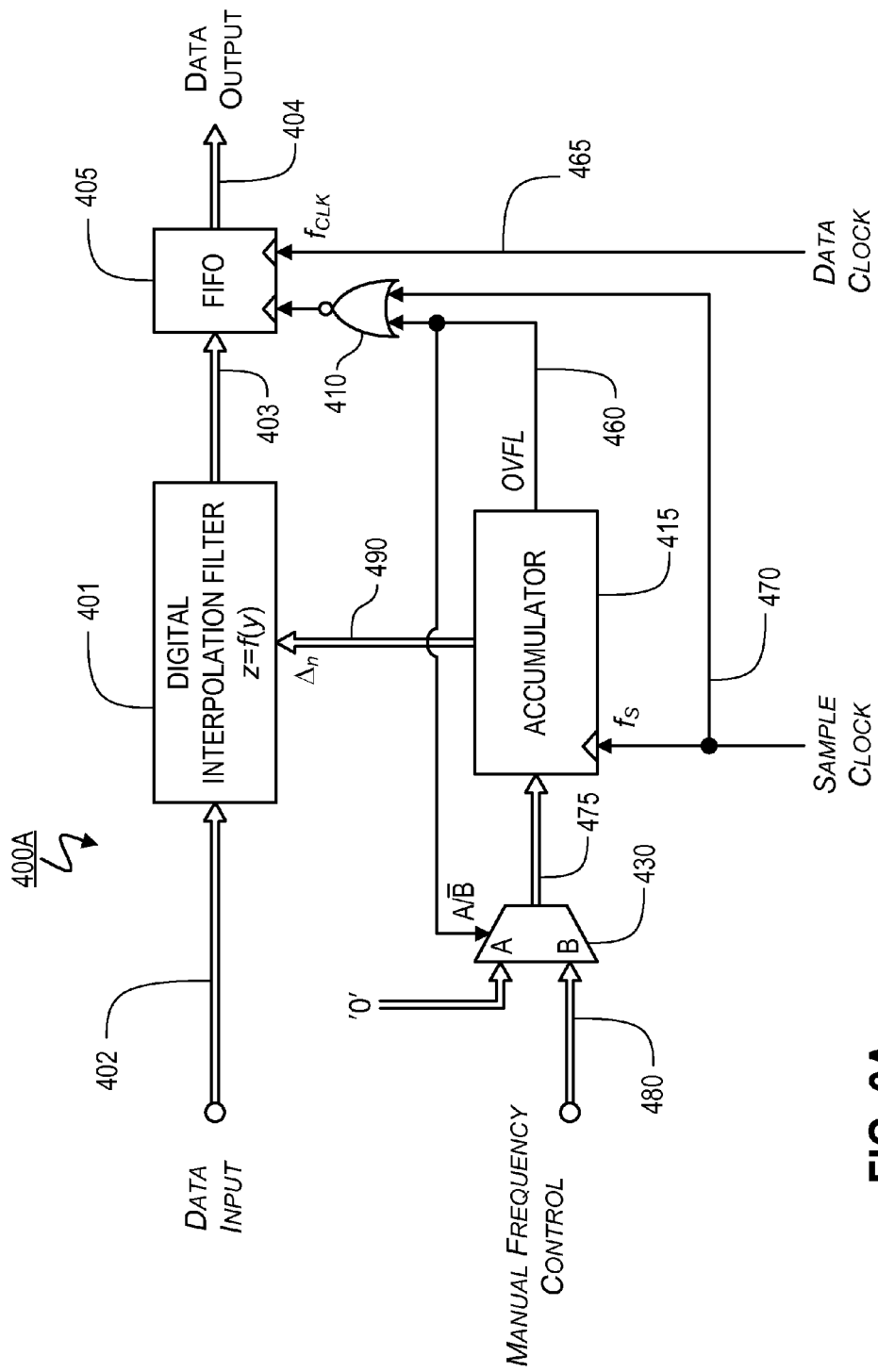
FIG. 6A is a block diagram illustrating an exemplary implementation of a digital resampling circuit that compensates for the difference between a higher sample-rate frequency and a lower conversion-rate frequency, where the ratio of the sample-rate frequency to conversion-rate frequency is a rational number.

An exemplary resampling interpolator 119A or 139A, according to the preferred embodiments of the present invention, is circuit 400A shown in FIG. 6A. Circuit 400A is comprised of: (1) digital interpolation filter 401; (2) accumulator 415; and (3) first-in, first-out (FIFO) memory 405. Digital interpolation filter 401 operates at the sample-rate frequency $f_S$ of the converter (i.e., the digital filter output rate), which preferably is greater than or equal to the conversion-rate frequency $f_{CLK}$ (i.e., $f_S \geq f_{CLK}$). Resampling interpolator circuit 400A performs a resampling operation, wherein input data 402 that has been sampled originally at the higher sample-rate frequency $f_S$, is resampled at the lower conversion-rate frequency $f_{CLK}$ according to data clock 465. In such an application, FIFO 405 is sometimes referred to in the prior art as a rate buffer, because the higher-rate input (i.e., rate $f_S$)

of FIFO 405 is buffered to a lower-rate output (i.e., rate $f_{CLK}$). The purpose of accumulator 415 is to track the difference between sample-rate clock 470 and conversion-rate clock 465, to prevent FIFO 405 from underflowing or overflowing. When accumulator overflow output 460 is in an inactive state (i.e., a low logic level), the operation of circuit 400A is as follows: (1) accumulator input 475 is equal to manual frequency control input 480 based on the configuration of multiplexer 430; (2) the value of interpolant 490 ($\Delta_n$) is updated on the rising edge of sample-rate clock 470 $f_S$); and (3) resampled data 403 are clocked into FIFO 405 on the falling edge of sample-rate clock 470 due to inversion in logical NOR gate 410. Conversely, when accumulator overflow output 460 is in an active state (i.e., a high logic level), the operation of circuit 400A is as follows: (1) accumulator input 475 is equal to zero based on the configuration of multiplexer 430; (2) interpolant 490 ($\Delta_n$) is not updated on the rising edge of sample-rate clock 470 ($f_s$) due to a value of zero at the accumulator input 475 from multiplexer 430; and (3) resampled data 403 are not clocked into FIFO 405 on the falling edge of sample-rate clock 470 because of logical NOR gate 410. How often overflow output 460 becomes active depends on the value of accumulator input 475, and preferably, the value of accumulator input 475 is such that the amount of data clocked into FIFO 405 is the same as the amount of data clocked out of FIFO 405 (i.e., no memory underflow or overflow).

In general, the operation of preferred accumulator 415 is somewhat similar to that of a conventional numerically-controlled oscillator (NCO). Referring to circuit 400A, accumulator output 490 (i.e., interpolant $\Delta_n$) is the modulo-sum of input 475, such that accumulator output 490 increments (or decrements) by an amount equal to the value of input 475, until a terminal value is reached. When a terminal value is reached, accumulator output 490 overflows (i.e., wraps) to a value equal to the difference between the resultant accumulated output value and the terminal value. Preferably, the terminal value of accumulator 415 is unity (i.e., terminal value equals 1), and the value (df) at accumulator input 475 is determined by the ratio of sample-rate frequency $f_S$ to desired conversion-rate frequency $f_{CLK}$, according to the equation:

$$df = \frac{f_S}{f_{CLK}} - 1.$$

In the preferred embodiments, the ratio $f_S/f_{CLK}$ is rational, a condition that occurs when $f_S$ and $f_{CLK}$ are multiples of a common reference frequency $f_{REF}$, such that for integers a, b, c, and d:

$$f_S = \frac{b}{a} \cdot f_{REF}, f_{CLK} = \frac{d}{c} \cdot f_{REF}, \text{ and } \frac{f_S}{f_{CLK}} = \frac{b}{a} \cdot \frac{c}{d} \geq 1.$$

In general, the above condition is not difficult to achieve using conventional frequency synthesis methods (e.g., direct-digital synthesis or factional-N PLL synthesis) and ensures that there is a finite-precision value df for which FIFO 405 does not overflow (or underflow). For the specific case where $f_S/f_{CLK}=5/4$, and therefore df=¼, the first seven values at output 490 (i.e., interpolant $\Delta_n$) of accumulator 415 are 0, ¼, ½, ¾, 0, 0, and ¼. In this particular example, accumulator output 490 transitions from a value of ¾ to a value of 0 when the accumulated result reaches the terminal value of 1, and the duplicate value of 0 results from accumulator overflow signal 460 that disables accumulation for a single cycle (i.e., via multiplexer 430).

The output 490 (i.e., interpolant $\Delta_n$) of accumulator 415 determines the amount by which the value (i.e., magnitude) of data inputs 402 are adjusted to reflect a different sample time. In the preferred embodiments, this magnitude adjustment is based on digital interpolation using a second-order, polynomial (i.e., parabolic) curve fit, that in a least-squares sense, minimizes the error between the data samples and the fitted second-order polynomial. Such second-order interpolation is realized using interpolation filter 401, that for input value y and output value z, performs the function $$z_n = y_n \cdot \left(\frac{1}{2}\Delta_n^2 + \frac{1}{2}\Delta_n\right) + y_{n-1} \cdot (1 - \Delta_n^2) + y_{n-2} \cdot \left(\frac{1}{2}\Delta_n^2 - \frac{1}{2}\Delta_n\right),$$

where $\Delta_n$ is the curve-fit interpolant (i.e., an independent, control variable that specifies the offset between a given sample-time instant and a desired sample-time instant). With respect to the above equation, negative interpolant values advance the sample-time instant (i.e., shift sampling to an earlier point in time) and positive interpolant values retard the sample-time instant (i.e., shift sampling to a later point in time). In alternate embodiments, however, the relationship between interpolant polarity and sample-time shift could be the opposite. It should be noted that since $$z_n = \begin{cases} y_n, & \Delta = +1 \\ y_{n-1}, & \Delta = 0 \\ y_{n-2}, & \Delta = -1, \end{cases}$$

the fitted curve error is zero (i.e., $z_i=y_i$) for an interpolant specifying a sample-time offset that coincides with an actual sample-time instant (e.g., $\Delta=0$ and $\Delta=+1$). In alternative embodiments of the invention, particularly converter applications where high-resolution performance is not critical (i.e., <<10-bit conversion accuracy), interpolation can be first-order, such that $$z_n = y_n \cdot (1+\Delta_n) - y_{n-1} \cdot \Delta_n.$$

For either first-order or second-order interpolation, the curve-fit interpolant $\Delta_n$ is time-varying, and preferably: (1) is generated using an accumulator 415 based on an input value 475 (i.e., as described above); and (2) accounts for differences in sample-rate frequency $f_S$ and conversion-rate frequency $f_{CLK}$ (i.e., via manual frequency control signal 480).

Figure 6B:
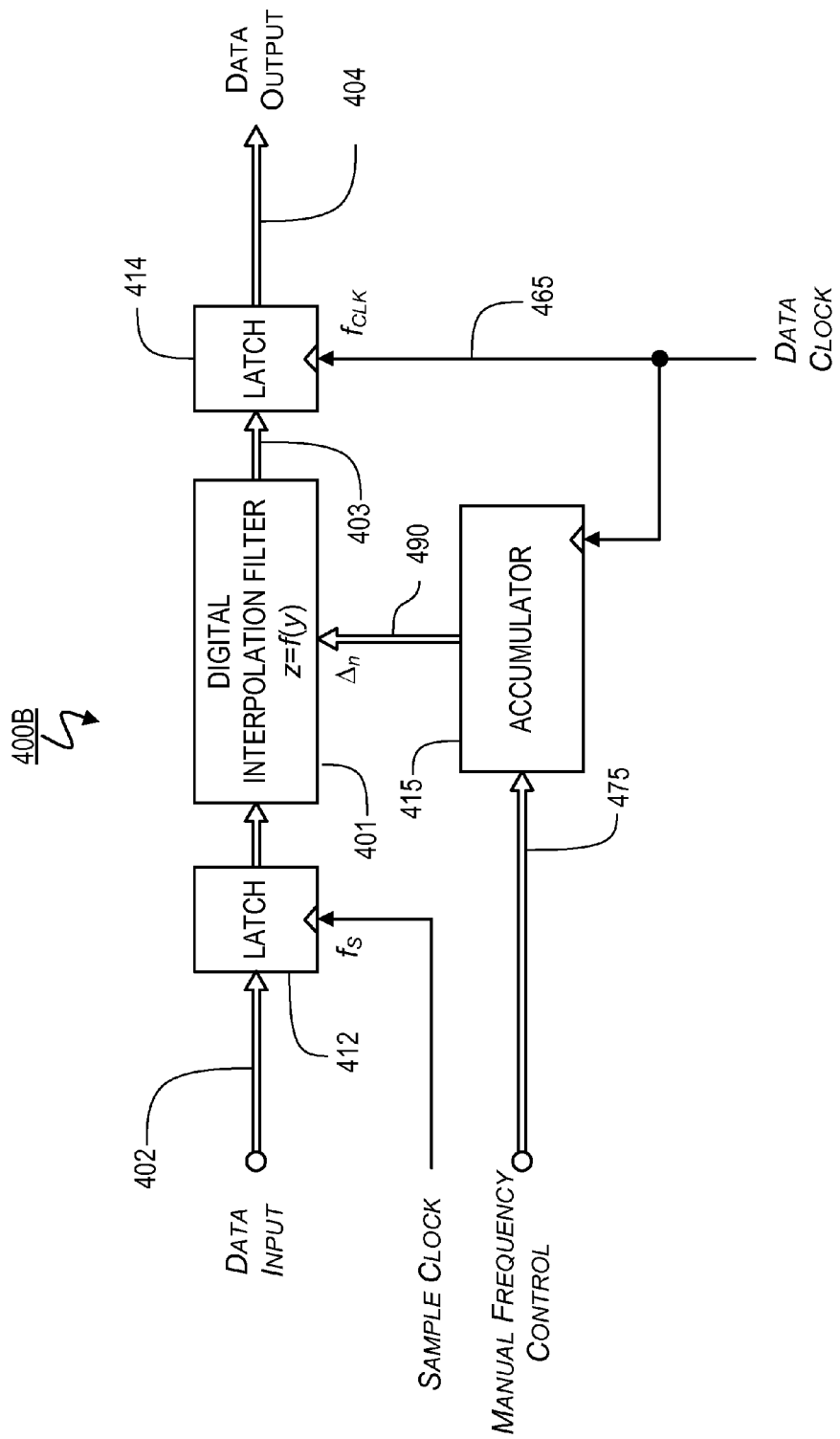
FIG. 6B is a block diagram illustrating an exemplary implementation of a digital resampling circuit that compensates for the difference between a sample-rate frequency and a conversion-rate frequency, where the ratio of the sample-rate frequency to conversion-rate frequency is an irrational number.

In the preferred embodiments, the ratio of sample-rate frequency to conversion-rate frequency (i.e., the ratio $f_S/f_{CLK}$) is rational. In alternate embodiments, however, the ratio $f_S/f_{CLK}$ is irrational and resampling interpolator circuit 400B, illustrated in FIG. 6B, preferably is used. The operation of circuit 400B is similar to that of circuit 400A, except that the interpolant value ($\Delta_n$) at the output 490 of accumulator 415, updates on the rising edge of the conversion-rate clock 465, instead of on the rising edge of sample-rate clock 470. As before, the value (df) at accumulator input 475 is determined by the ratio of sample-rate frequency $f_S$ to desired conversion-rate frequency $f_{CLK}$, according to the equation:

$$df = \frac{f_S}{f_{CLK}} - 1.$$

Since data samples (i.e., input signal 402) are clocked into digital interpolation filter 401 at rate $f_S$ (i.e., via optional latch 412 in FIG. 6B) and interpolated at a different rate $f_{CLK}$, circuit 400B operates in an asynchronous manner, creating the potential for logic metastability conditions at the output 403 of digital interpolation filter 401. Therefore, data samples at output 403 are reclocked in latch 414, using conversion-rate clock 465. Latch 414 acts as a conventional metastability buffer to allow logic levels to reach a stable equilibrium state, before being coupled onto data output line 404.

Embodiments Also Employing at Least One Sampling Error Detector

A third representative embodiment of a jitter-tolerant converter, according to the present invention, is circuit 200 illustrated in FIG. 5C. Converter circuit 200 is comprised of M processing branches, with each branch (e.g., branch 160 or 170) including a sampling/quantization circuit (e.g., circuit 113 or 123) and a digital reconstruction filter (e.g., bandpass filter 115 or 125). The outputs of processing branches 115 and 170 are combined in adder 105. In addition, circuit 200 includes: (1) sample-rate clock sources (e.g., oscillator 111B) that are independent of (potentially providing different sample rates than) the conversion-rate (data) clock source 103; (2) a sampling error detector (e.g., circuit 117) coupled to the output of the sample-rate clock source 111B; and (3) preferably plural resampling interpolators (e.g., circuit 119B), each being coupled to the single or combined (e.g., via adder 105) output(s) of $K_j$ processing branches, where each $K_j \leq M$.

In the preferred embodiments, the sampling error detector 117 compares the output frequency (i.e., actual frequency) of the sample clock source 111B to a desired frequency (i.e., reference frequency), and produces an error signal 112 that is proportional to the difference between the actual frequency and the desired frequency. In the present embodiment, the error signal 112 is coupled to resampling interpolator 119B, along with the combined (i.e., via adder 105) output 108 of digital bandpass filters 115 and 125. The combined output 108 of these digital bandpass filters typically has been corrupted by sample-time uncertainty (jitter), and consequently, the resampling interpolator 119B does not directly pass on the jitter-corrupted data samples from the output of adder 105. Instead the resampling interpolator outputs, at a rate determined by data clock 103, an estimate of what would have been correct data samples (i.e., in the absence of sampling uncertainty) based on the error signal from the sampling error detector. In the representative embodiment of circuit 200, therefore, the resampling interpolator serves two purposes: (1) it compensates for the effects of sampling errors in order to approximate a condition of perfect sampling; and (2) it compensates for the difference between the actual instantaneous sample-rate frequency and the desired conversion-rate frequency. In conjunction, the sampling error detector circuit 117 and the resampling interpolator circuit 119B form a feed-forward control system for mitigating conversion errors due to sample-time jitter. As indicated, the entire subcircuit 201 can be substantially replicated any number of times, with each subcircuit including any number of processing branches and with the different subcircuits potentially using oscillators that operate at different frequencies, and the outputs of all such subcircuits are coupled into adder 106 in order to produce the final output signal 102.

Figure 7A:
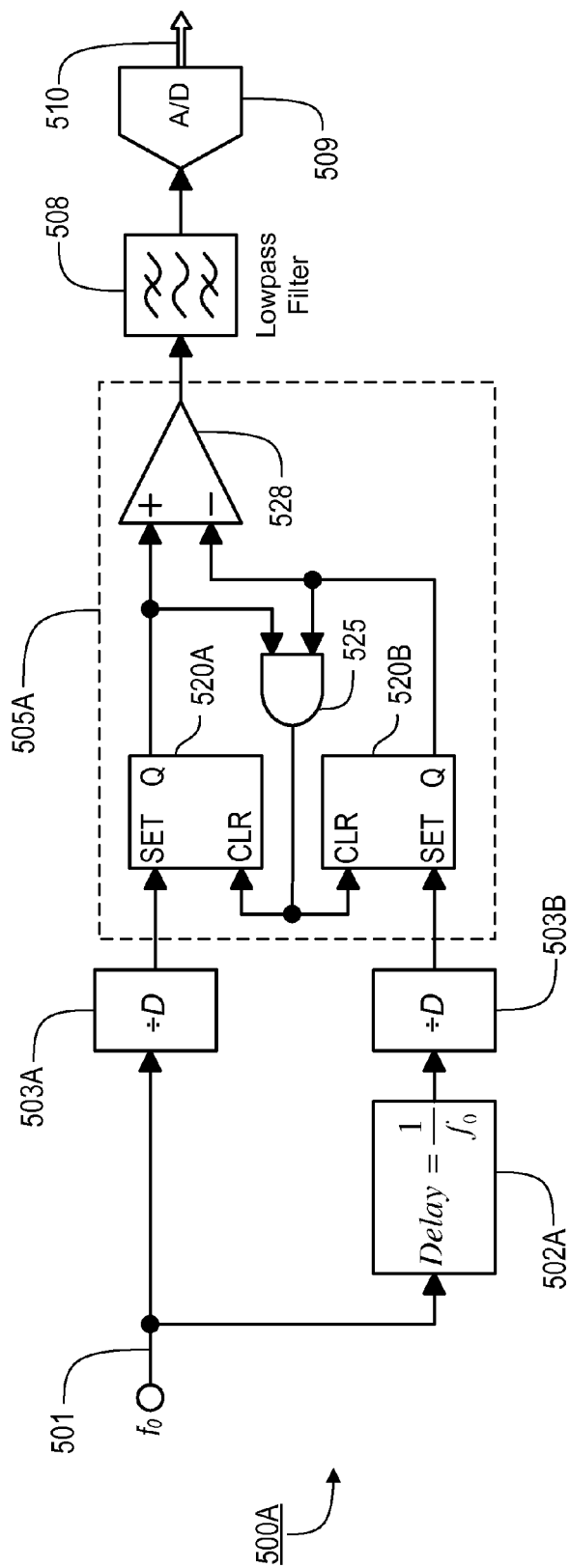
FIG. 7A is a sampling error detector according to a representative embodiment of the invention that incorporates a single delay element, a phase/frequency detector, a lowpass filter, and an analog-to-digital converter.
Figure 7B:
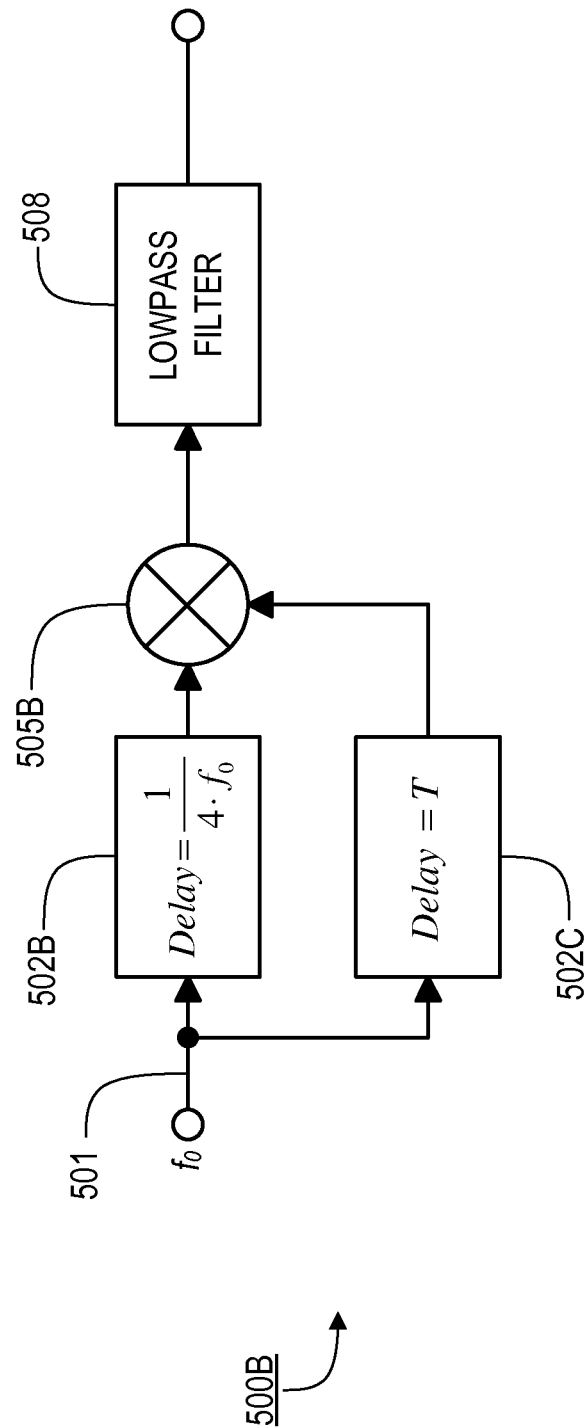
FIG. 7B is a block diagram of a conventional frequency discriminator circuit that incorporates delay elements, a mixer, and a lowpass filter.

The preferred sampling error detector 117, e.g., for use in representative circuit 200 shown in FIG. 5C, is circuit 500A shown in FIG. 7A. In some respects, the preferred sampling error detector circuit 500A is similar in functionality to a conventional frequency-discriminator circuit, such as circuit 500B (which has been used, e.g., for analog FM demodulation) illustrated in FIG. 7B. Referring to conventional frequency-discriminator circuit 500B, when input signal 501 has frequency $f_0$, delay element 502B has delay $1/(4 \cdot f_0)$ and delay element 502C has a delay T, the output x of mixer 505B is equal to $$x = \sin(2\pi \cdot f_0 \cdot t)\cos(2\pi \cdot f_0 \cdot t + 2\pi \cdot f_0 \cdot T)$$
$$= \frac{1}{2}\sin(2\pi \cdot f_0 \cdot T) + \frac{1}{2}\sin(4\pi \cdot f_0 \cdot t + 2\pi \cdot f_0 \cdot T),$$

and the corresponding output y of lowpass filter 508 is equal to $$y = \sin(2\pi \cdot f_0 \cdot T)$$
$$\approx 2\pi \cdot T \cdot f_0.$$

Thus, the signal level y at the output of frequency-discriminator circuit 500B is approximately proportional to the input frequency $f_0$, with a constant of proportionality equal to $2\pi T$. Preferred sampling error detector circuit 500A has some similarities to the conventional frequency-discriminator circuit 500B, but instead of producing an output level that is proportional to the input frequency, the present sampling error detector produces an output level that is proportional to the difference ($\Delta f$) between a desired frequency $f_0$ (determined by the amount of constant time delay provided by delay element 502A) and the actual frequency at the detector's input. In addition, because the sample error detector 500A preferably employs an edge-triggered phase-frequency detector 505A, comparable in operation to a conventional MC100EP40/140 from ON Semiconductor, the preferred sampling error detector of the present invention needs only a single delay element (e.g., circuit 502A in FIG. 7A). Somewhat similar to the conventional frequency-discriminator circuit 500B, the gain of the preferred sampling error detector of the present invention is proportional to $T \Delta_f$, where T is the delay of delay element 502A. Preferably, delay element 502A is implemented using passive structures, such as transmission lines, LC lattice networks, or piezoelectric devices (e.g., quartz, surface acoustic wave, bulk acoustic wave). But alternatively, delay element 502A may be implemented as an active device.

Referring to circuit 500A in FIG. 7A, the sampling error detector is comprised of: (1) delay element 502A, (2) frequency dividers (counters) 503A&B, (3) phase-frequency detector 505A, (4) lowpass filter 508, and (5) analog-to-digital converter 509. For delay element 502A with fixed delay $T = 1/f_0$, circuit 500A produces digital output 510 that is proportional in value (magnitude) to the difference between the frequency at its input 501 and a desired frequency $f_0$, as noted in the previous paragraph. The purpose of frequency dividers 503A&B is to reduce the rate at which phase-frequency detector 505A operates. Preferably the frequency divider ratio D=1, but in alternate embodiments D>1 such that phase-frequency comparisons are made at a rate less than $f_0$. Specifically, the operation of circuit 500A is such that: 1)

when the frequency at input 501 is equal to $f_0$, flip-flops 520A and 520B are reset and the output of amplifier 528 is zero; 2) when the frequency at input 501 is greater than $f_0$, flip-flop 520A is set for a period of time that is proportional to the frequency difference, and the output of amplifier 528 is a positive pulse; and 3) when the frequency at input 501 is less than $f_0$, flip-flop 520B is set for a period of time that is proportional to the frequency difference, and the output of amplifier 528 is a negative pulse. The pulsed output of amplifier 528 is then processed by lowpass filter 508 to produce an analog (continuously variable) voltage that is proportional to the difference between the frequency at input 501 and the desired frequency $f_0$ (i.e., a voltage that is proportional to the width of the output pulses of amplifier 528). Further processing in analog-to-digital converter circuit 509, transforms the analog voltage at the output of lowpass filter 508 into digital output value 510. By the mechanism described above, the digital output 510 has a value that corresponds proportionally to the frequency fluctuations appearing on input 501. Therefore, a sampling error detector 117 according to the preferred embodiments, provides a suitable measure for correcting conversion errors related to sampling uncertainty (jitter). In alternate embodiments, a conventional frequency-discriminator circuit, similar to circuit 500B, can provide a measure for correcting conversion errors.

Referring back to representative circuit 200 in FIG. 5C, when the output frequency (i.e., sample-rate frequency) of the sample clock source has been offset (corrupted) by noise and/or circuit instabilities that produce frequency fluctuations (e.g., jitter, wander, or drift), the output of the sampling error detector circuit 117 is offset by a proportional amount (i.e., a linear relationship) as described above. Similarly, a frequency offset in the sample clock output (e.g., the output of oscillator 111B) produces a corresponding offset (error) in the value (magnitude) of the bandlimited signal at the output of the digital bandpass filter (e.g., filter 115 or 125). To correct the conversion errors (i.e., offsets) in the sampled output values of the digital bandpass filter (e.g., filter 115 or 125), which are introduced by sample-time uncertainty, the resampling interpolator 119B preferably uses a digital resampling technique that is based on a parabolic interpolation between sampled output values. However, in alternate embodiments, digital resampling can be based on linear or nonlinear (e.g., sinusoidal or cubic) interpolation between sampled output values.

Figure 6C:
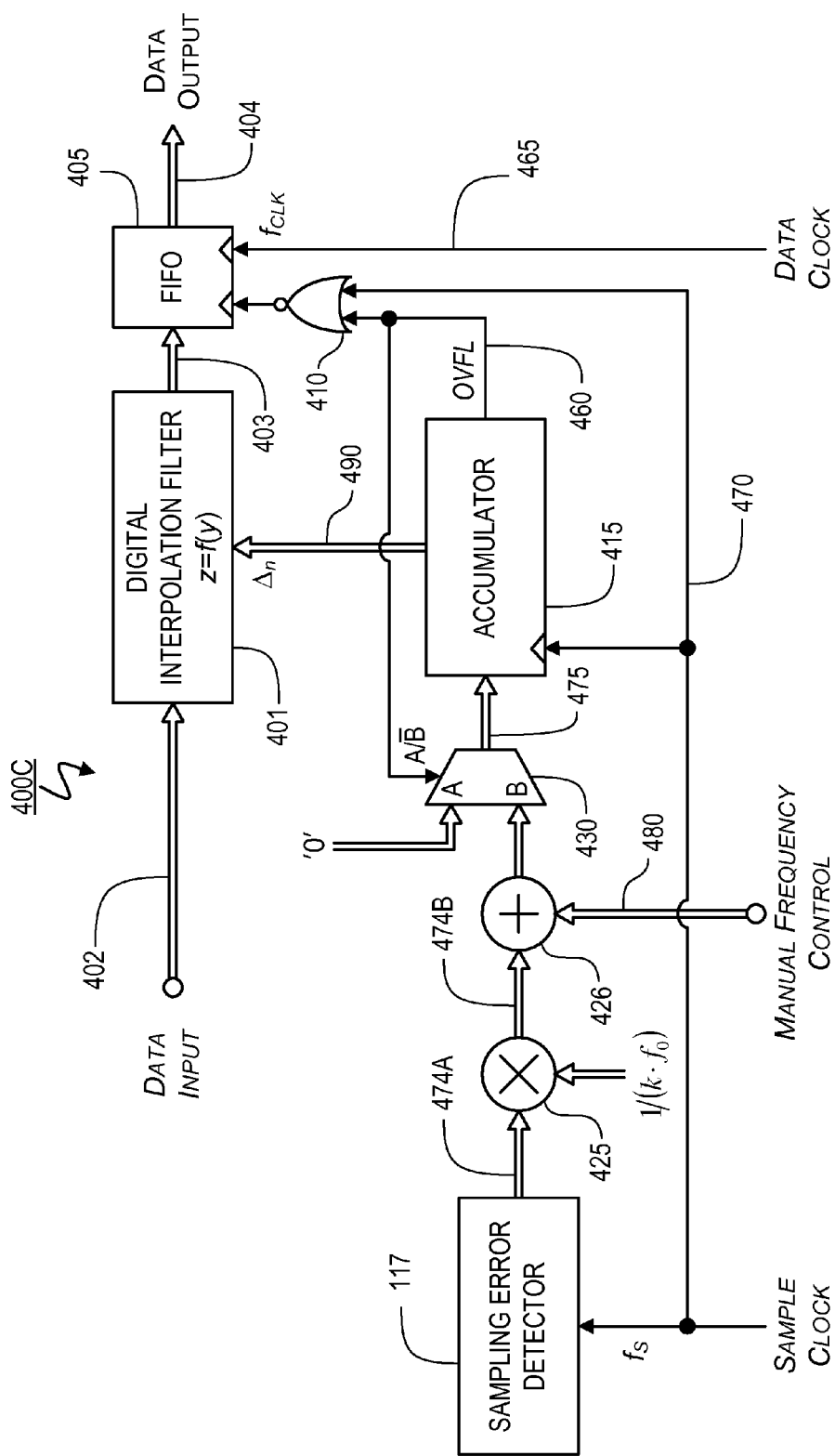
FIG. 6C is an exemplary implementation of a digital resampling circuit that compensates for sample-rate uncertainty, in addition to differences between a sample-rate frequency and a conversion-rate frequency.

In the preferred embodiments, the resampling interpolator circuit 119B in FIG. 5C resamples the outputs of the digital bandpass filters (e.g., filters 115 and 125 in FIG. 5C) at the conversion-rate frequency $f_{CLK}$. More preferably, the resampling interpolator also compensates for undesired frequency fluctuations (i.e., jitter) in sample-rate frequency $f_S$, e.g., using exemplary circuit 400C shown in FIG. 6C. The operation of circuit 400C is similar to that of circuit 400A, except that input 475 to the accumulator 415 is a combination of: (1) manual frequency control (MFC) value 480 that accounts for differences between the sample-rate frequency $f_S$ and the conversion-rate frequency $f_{CLK}$; and (2) automatic frequency control (AFC) value 474B that accounts for undesired fluctuations (i.e., sampling jitter) in the sample-clock frequency $f_S$. Automatic frequency control value 474B preferably is a scaled version of output 474A from sampling error detector 117, which as described above, produces an output δ that is proportional to the difference between the sample-rate frequency $f_S$ and a desired frequency $f_0$, such that $$\delta = k \cdot (f_S - f_0).$$

For resampling at the desired rate $f_0$, the automatic frequency control value AFC that is applied to the NCO 415 preferably is $$AFC = \frac{f_S}{f_0} - 1 = \delta \cdot \frac{1}{k \cdot f_0}.$$

In circuit 400C, the scaling term $1/(k \cdot f_0)$ is applied using multiplier 425, and the AFC value is combined with the MFC value using adder 426.

Digital Bandpass (Reconstruction) Filter Considerations

The primary considerations for the digital bandpass filters (e.g., filters 115, 125, and 135) according to the preferred embodiments of the present invention are: (1) design complexity (preferably expressed in terms of required multiplications and additions), (2) frequency response (particularly stopband attenuation), (3) amplitude and phase distortion, and (4) latency. The best converter-resolution and jitter-tolerance performance is obtained for digital bandpass filters having frequency responses that exhibit high stopband attenuation, which generally increases with increasing filter order. In addition, it is preferable for the digital bandpass filter responses to have suitable (e.g., perfect or near-perfect) signal-reconstruction properties to prevent conversion errors due to amplitude and phase distortion. Filter (i.e., amplitude and phase) distortion is a particularly important consideration because, unlike noise from quantization and jitter, filter distortion levels do not improve as filter order increases or as the number of parallel-processing branches M increases. Therefore, filter distortion prevents converter resolution from improving with increasing filter order or with increasing M. Also, although stopband attenuation generally increases with filter order, increases in filter order result in greater processing latency, especially for transversal, finite-impulse-response (FIR) filters. Digital bandpass filters with low latency are preferred to support applications where latency can be a concern, such as those involving control systems and servo mechanisms. For these reasons, the jitter-tolerant converter preferably employs bandpass moving-average (BMA) filters, which can result in: (1) high levels of stopband attenuation (i.e., attenuation of noise from quantization and jitter), (2) insignificant amplitude and phase distortion (i.e., near-perfect signal reconstruction), and (3) significantly lower complexity than other approaches.

For high-resolution converter applications (e.g., requiring up to 10 bits of conversion accuracy), the present inventor has discovered that conventional, transversal window filters (e.g., Blackman-Harris, Hann or Kaiser window filters) have suitable stopband attenuation and signal-reconstruction properties for two-sided bandwidths of $\Omega_B/(N \cdot M)$ and impulse-response lengths of $4 \cdot N \cdot M$, or less, where M is the number of processing branches and N is the excess-rate oversampling ratio $$\left(\text{i.e., } N = \frac{1}{2} \cdot \frac{f_S}{\Omega_B}\right).$$

However, the present inventor has also discovered that recursive window filters are a preferable alternative to conventional, transversal FIR filter banks, because recursive window filters exhibit equivalent properties to transversal window filters, but typically can be implemented more efficiently, i.e., with fewer adds (adders or addition operations) and multiplies (multipliers or multiplication operations). For example, consider a lowpass prototype (i.e., zero-frequency-centered) filter with impulse response $$h_{win}(n) = a_0 - a_1 \cdot \cos\left(\frac{2\pi n}{L-1}\right) + a_2 \cdot \cos\left(\frac{4\pi n}{L-1}\right) - a_3 \cdot \cos\left(\frac{6\pi n}{L-1}\right),$$

where $a_0$=0.35875, $a_1$=0.48829, $a_2$=0.14128, $a_3$=0.01168, and L=4·(N·M−1). This filter response, which is defined in the prior art as a Blackman-Harris window filter response, realizes signal-to-distortion power ratios (SDR) of greater than 84 dB (i.e., 14-bit resolution). As significantly, this filter has a recursive transfer function equal to $$T_{win}(z) = a_0 \cdot \frac{1-z^{-L}}{1-z^{-1}} - \sum_{i=1}^{3} a_i \cdot \frac{1-\cos\left(\frac{2\pi i}{L-1}\right) \cdot (z^{-1} + z^{-L}) + z^{-(L+1)}}{1 - 2 \cdot \cos\left(\frac{2\pi i}{L-1}\right) \cdot z^{-1} + z^{-2}},$$

which requires only 10 multiply operations for lowpass filtering, regardless of the filter impulse response length L. Additional multiplication operations are required for transforming the lowpass prototype response to a bandpass response, using downconversion followed by upconversion, but the recursive window filters still represent a considerable complexity savings over the transversal FIR approaches used in conventional filter banks. However, the present inventor has discovered that when recursive window filters of this form are implemented using high-frequency, parallel-processing methods, such as polyphase decomposition, the complexity costs associated with coefficient dynamic range expansion can exceed any complexity savings afforded by the recursive structure.

Figure 8:
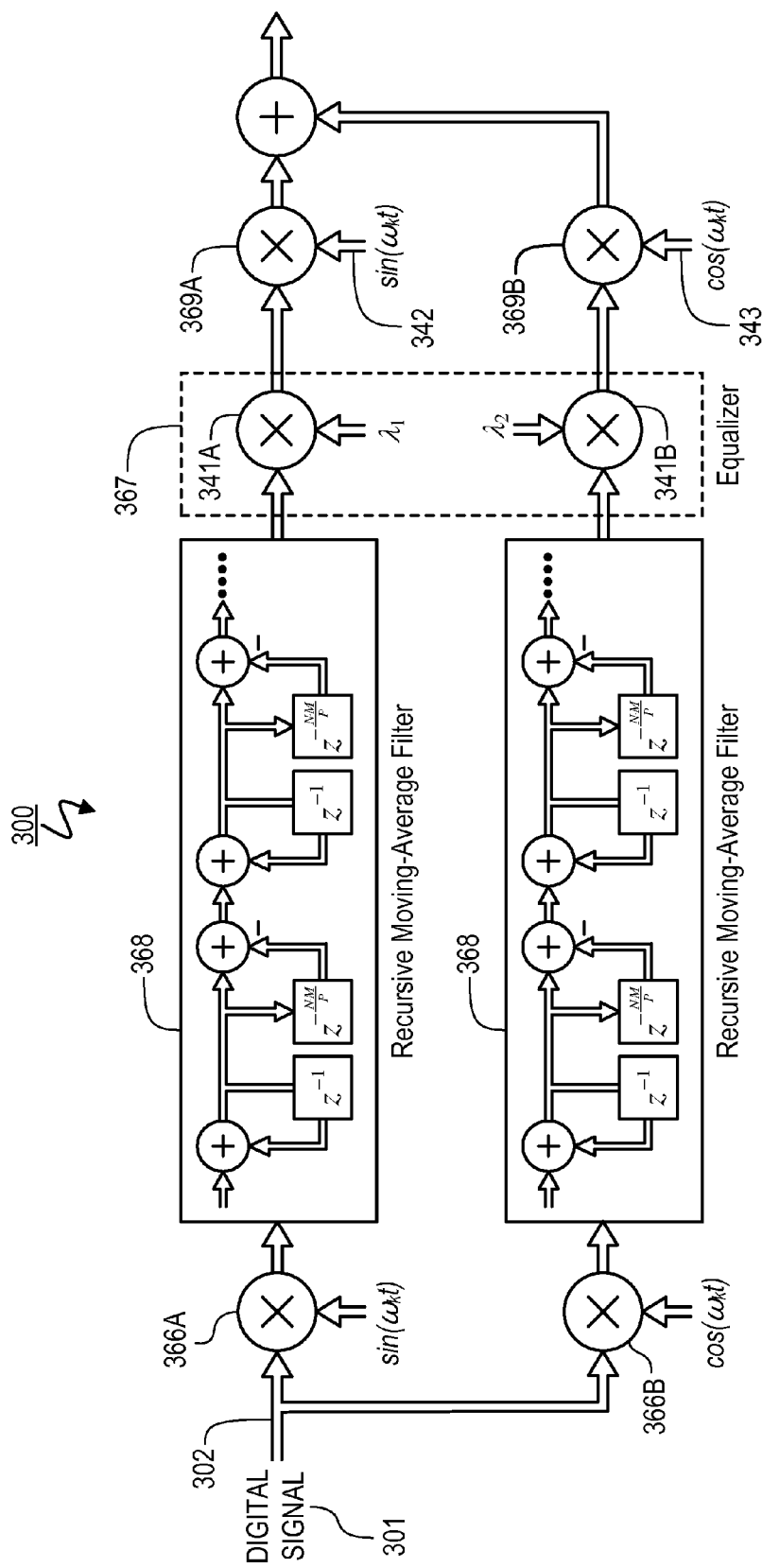
FIG. 8 is a block diagram of a bandpass moving-average (BMA), signal-reconstruction filter according to a representative embodiment of the invention that includes recursive moving-average filters with quadrature frequency conversion.

Bandpass moving-average (BMA) filters are used in the preferred embodiments of the invention, instead of conventional transversal window filters or recursive window filters, because BMA filters feature high stopband attenuation and negligible amplitude and phase distortion, in conjunction with low complexity. A block diagram of an exemplary BMA filter 300 is given in FIG. 8. As FIG. 8 illustrates, a BMA filter according to the present embodiment of the invention consists of: (1) a quadrature downconverter (i.e., the combination of multipliers 366A&B) that uses sine and cosine sequences to shift the band of the input digital signal 302 from a center frequency of $\omega_k$ (i.e., the center frequency of the associated processing branch) to a center frequency of zero; (2) a pair of cascaded moving-average filters 368 that preferably attenuate noise from quantization and jitter without introducing appreciable amplitude or phase distortion using operations comprising only adders and delay registers (i.e., no multipliers); (3) a complex single-tap equalizer 367 (i.e., dual multiplier) that applies an amplitude and/or phase correction factor to the output of the moving-average filters 368 (i.e., via scalar coefficients $\lambda_1$ and $\lambda_2$); and (4) a quadrature upconverter (i.e., the combination of multipliers 369A&B) that uses sine and cosine sequences to shift the output of moving-average filter 368 from a center frequency of zero back to a center frequency of $\omega_k$ (i.e., the original center frequency of the associated processing branch). It should be noted that when the sub-band associated with a particular branch is centered at zero hertz (e.g., such as for analog downconversion prior to sampling/quantization), the quadrature downconversion function can be eliminated, for example, by: (1) setting the downconversion cosine sequence to all ones; and (2) setting the downconversion sine sequence to all zeros. BMA 300 preferably introduces negligible amplitude and phase distortion by combining cascaded moving-average filters 368, having near-perfect reconstruction properties, with sinusoid-based quadrature downconversion 366A&B and upconversion 369A&B operations for transforming prototype BMA 300 lowpass responses to bandpass responses.

The BMA equalizer, shown as a complex, single-tap filter 367 in FIG. 8, corrects for phase and/or amplitude (i.e., gain) offsets that may occur among the M parallel processing branches due to: (1) mismatches in the insertion loss and propagation delay of analog input filters (e.g., filters 112 and 122), and (2) sampling/quantization circuits (e.g., circuits 113, 123, and 133) with signal transfer functions that deviate from an ideal all-pass response. As will be readily appreciated, the BMA equalizer 367 can be moved upstream of the moving-average filter 368, and/or any portion or all of the equalizer 367 desired transfer function can be moved upstream of the moving-average filter 328, without affecting the overall transfer function of BMA filter 300. As will be further readily appreciated, the BMA equalizer 367 can be moved downstream of the quadrature upconverter (i.e., dual multipliers 369A&B). In other embodiments of the present invention, the BMA equalizer 367 function is integrated with the quadrature upconverter by directly scaling the amplitude and/or phase of the sine sequence 342 and cosine sequence 343 that shift the output of BMA filter 300 from a center frequency of zero back to a center frequency of $\omega_k$ (i.e., dual multipliers 369A&B simultaneously provide equalization and upconversion). More specifically, in these other embodiments, the sine sequence 342 becomes $A \cdot \sin(\omega_k + \theta)$ and the cosine sequence 343 becomes $A \cdot \cos(\omega_k + \theta)$, where $A = \sqrt{\lambda_1 + \lambda_2}$ and $\theta = \tan^{-1}(\lambda_1/\lambda_2)$.

The moving-average prototype filters 368 utilized in the bandpass moving-average (BMA) filters preferably have the general transfer function $$F(z) = \prod_{i=0}^{R-1} \left(\frac{1 - z^{-2NM/P_i}}{1 - z^{-1}}\right)^{P_i},$$

where filter parameters R, $P_i$ and $p_i$ are integers, and the exponent $-2 \cdot N \cdot M/P_i$ is also an integer. This moving-average prototype filter has a one-sided, 3 dB bandwidth $$f_{3db} \approx \frac{1}{2} \cdot \frac{f_S}{N \cdot M / P_i},$$

where $f_S$ is the filter sample-rate frequency (i.e., the converter sample-rate frequency), M is the number of processing branches, and N is the converter excess-rate oversampling ratio defined above. Therefore, the one-sided bandwidth of the moving-average prototype filter is inversely proportional to N, and for M filters (i.e., M processing branches), the overall, two-sided bandwidth of the composite BMA filter bank is $f_S/N$ for $P_i$=1. The center frequency of each BMA filter is determined directly by the period of the sine and cosine sequences used for quadrature downconversion, and preferably is set to coincide with the center of the sub-band intended to be converted by the corresponding processing branch.

The complexity of the moving-average filter prototype increases as the number of cascaded stages S increases, and therefore, S which is given by $$S = \sum_{i=0}^{R-1} p_i,$$

is preferably small, e.g., S≤3. The stopband attenuation of the BMA filter bank increases with increasing prototype filter impulse response length, L, given by $$L = 1 + \sum_{i=0}^{R-1} p_i \cdot (2NM/P_i - 1).$$

The amplitude and phase distortion introduced by the BMA filter bank is minimized (i.e., maximum SDR) for prototype filter impulse responses of length L≤4·N·M−1, where as before, M is the number of processing branches and N is the converter excess-rate oversampling ratio. Thus, for maximum converter resolution, the prototype filter parameters R, $P_i$ and $p_i$ preferably result in a prototype filter of length L=4·N·M−1, or as close to that as possible. However, stopband attenuation is not a one-to-one function of L. Specifically, some L-length prototype moving-average filters realize greater stopband attenuation than other L-length prototype moving-average filters. More preferably, therefore, the three BMA prototype filter parameters are optimized, for example using trial-and-error or a conventional constrained optimization method, such that both signal-to-distortion ratio (SDR) and stopband attenuation meet the minimum levels needed to achieve a specified converter resolution (e.g., combined SDR and stopband attenuation preferably exceeding ~60 dB for 10-bit resolution)

Besides exhibiting near-perfect reconstruction properties and realizing high levels of stopband attenuation, cascaded moving-average prototype filters can be very low in complexity because they require no multiplication operations. For example, the 3-stage (i.e., S=3) prototype filter transfer function given by $$F(z) = \left(\frac{1-z^{-2NM}}{1-z^{-1}}\right)\left(\frac{1-z^{-NM}}{1-z^{-1}}\right)^2$$

requires only 6 additions, independent of filter length (L=4·N~M−2), plus 4·M+3 registers. With these moving-average prototype filters, the only multiplication operations required are those necessary for transforming lowpass responses to bandpass responses. Bandpass transformation based on quadrature downconversion and upconversion, as shown in FIG. 8, requires only 4 multiplies when direct digital synthesis (e.g., employing digital accumulators with sine/cosine lookup memories) is employed to generate the sine and cosine sequences that are used for the quadrature downconversion and upconversion operations. Alternatively, the sine ($x_n$) and cosine ($y_n$) sequences can be generated using CORDICs (i.e., COordinate Rotation DIgital Computer) or other recursive operations that require no memory, such as those represented by the difference equations:

$$x_n = -2\cos(\omega_0) \cdot x_{n-1} + x_{n-2}$$

$$y_n = -\sin(\omega_0) \cdot x_{n-1} - 2\cos(\omega_0) \cdot y_{n-1} + y_{n-2}.$$

Although bandpass moving-average (BMA) filters based on cascaded moving-average filter prototypes, such as filter 368 described above, generally are preferred because such structures provide a substantial savings in computational complexity, particularly for large M (i.e., M≥8), the conventional, transversal FIR filter bank and transversal window filter approaches can provide equal or less complexity for small M.

System Environment

Generally speaking, except where clearly indicated otherwise, all of the systems, methods, functionality and techniques described herein can be practiced with the use of one or more programmable general-purpose computing devices. Such devices typically will include, for example, at least some of the following components interconnected with each other, e.g., via a common bus: one or more central processing units (CPUs); read-only memory (ROM); random access memory (RAM); input/output software and circuitry for interfacing with other devices (e.g., using a hardwired connection, such as a serial port, a parallel port, a USB connection or a FireWire connection, or using a wireless protocol, such as Bluetooth or a 802.11 protocol); software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; a display (such as a cathode ray tube display, a liquid crystal display, an organic light-emitting display, a polymeric light-emitting display or any other thin-film display); other output devices (such as one or more speakers, a headphone set and a printer); one or more input devices (such as a mouse, touchpad, tablet, touch-sensitive display or other pointing device, a keyboard, a keypad, a microphone and a scanner); a mass storage unit (such as a hard disk drive or a solid-state drive); a real-time clock; a removable storage read/write device (such as for reading from and writing to RAM, a magnetic disk, a magnetic tape, an opto-magnetic disk, an optical disk, or the like); and a modem (e.g., for sending faxes or for connecting to the Internet or to any other computer network via a dial-up connection). In operation, the process steps to implement the above methods and functionality, to the extent performed by such a general-purpose computer, typically initially are stored in mass storage (e.g., a hard disk or solid-state drive), are downloaded into RAM and then are executed by the CPU out of RAM. However, in some cases the process steps initially are stored in RAM or ROM.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, workstations, personal (e.g., desktop, laptop, tablet or slate) computers and/or even smaller computers, such as PDAs, wireless telephones or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality of this invention. Such media include, by way of example, magnetic disks, magnetic tape, optically readable media such as CDs and DVDs, or semiconductor memory such as PCMCIA cards, various types of memory cards, USB memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server device, computer-readable medium or other storage device, client device, or any other kind of device, such references should be understood as encompassing the use of plural such processors, computers, server devices, computer-readable media or other storage devices, client devices, or any other devices, except to the extent clearly indicated otherwise. For instance, a server generally can be implemented using a single device or a cluster of server devices (either local or geographically dispersed), e.g., with appropriate load balancing.

Additional Considerations.

Figure 9:
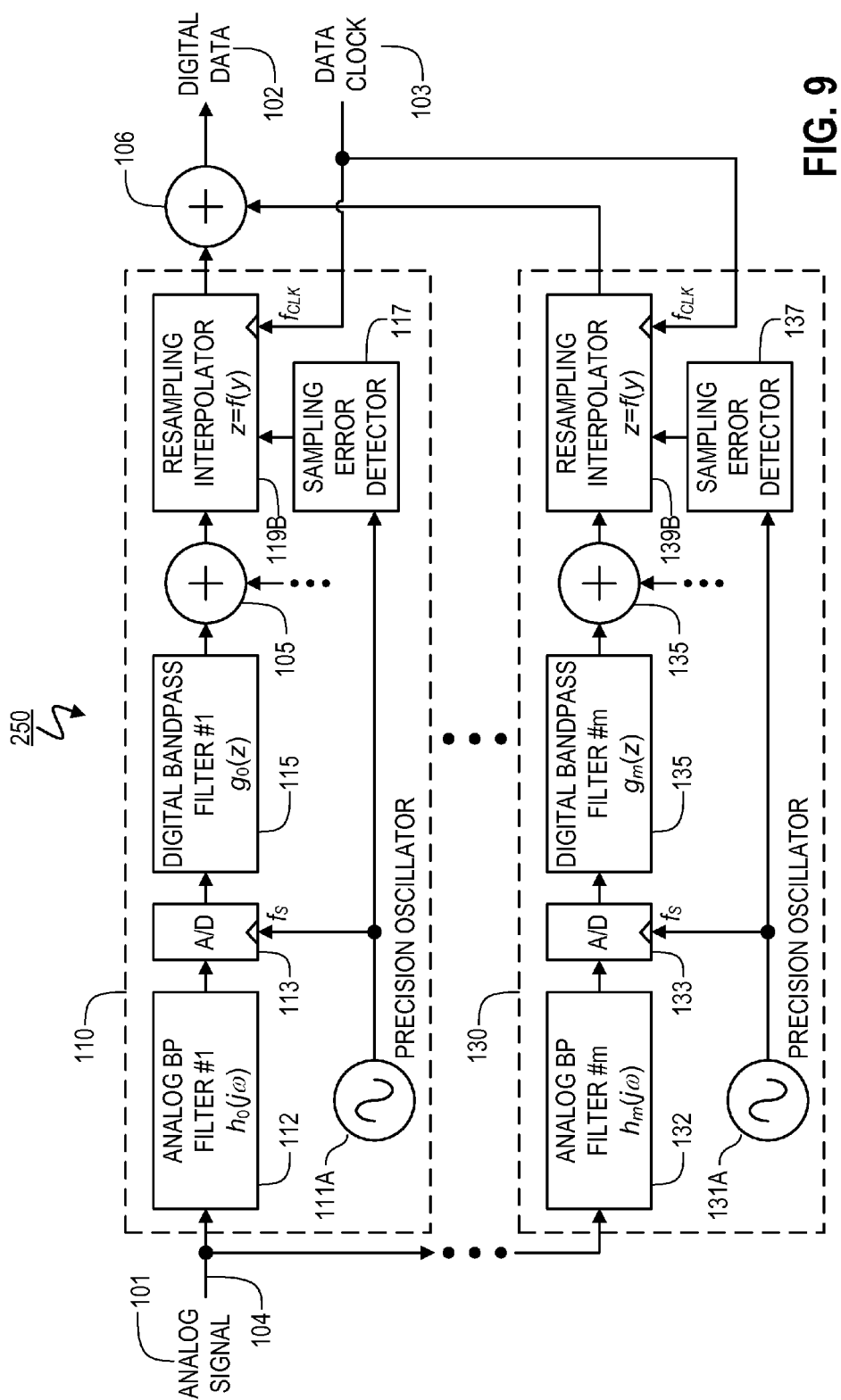
FIG. 9 is a simplified block diagram of a representative embodiment of the present invention that incorporates both analog bandpass filtering and digital resampling to mitigate errors due to sampling uncertainty.

To improve overall conversion accuracy, the present invention can incorporate any combination of: (1) analog input filters to reduce the level of output noise introduced by sampling uncertainty; (2) resampling interpolators to compensate for the sample-time offsets introduced by sampling uncertainty; and (3) precision, fixed-frequency oscillators to reduce the fluctuations in sample-rate frequency that produce sampling uncertainty. An exemplary jitter-tolerant converter that incorporates all three of the above components, according to a representative embodiment of the invention, is circuit 250 illustrated in FIG. 9. Also, in circuit 250, each of the M processing branches incorporates a dedicated sampling error detector (e.g., circuit 117 or 137) and a dedicated resampling interpolator (e.g., circuit 119B or 139B), which is a preferable configuration for small MN (e.g., M·N≤16). In addition, use of the present invention with complementary conventional jitter attenuators, such as phase-locked loops should be considered within the scope of the invention.

Figure 10:
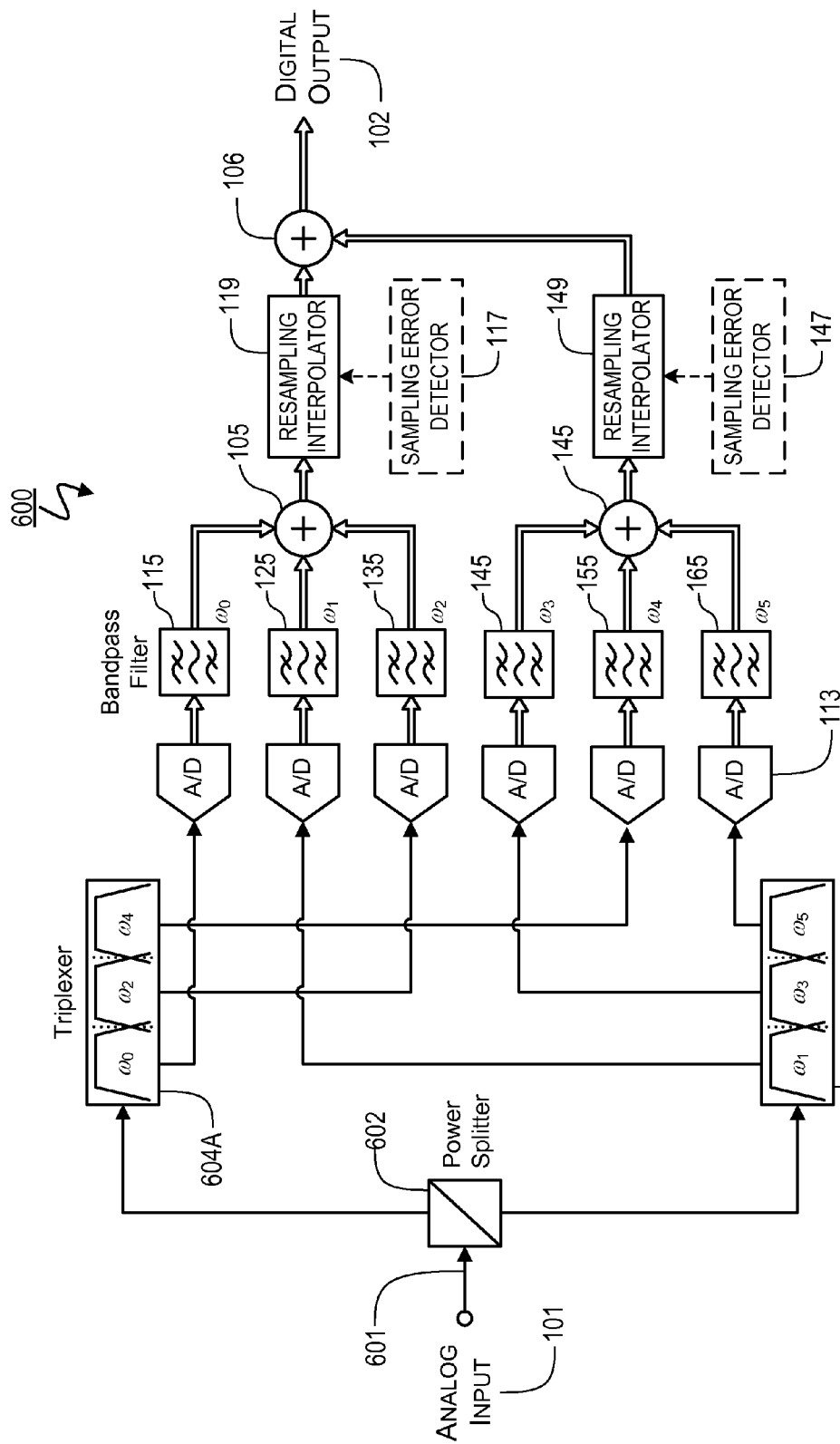
FIG. 10 is a block diagram of a complete converter according to a representative embodiment of the invention, illustrating an exemplary method for signal distribution across multiple converter processing branches using a power splitter and analog triplexers that together form overlapping sub-bands.

Furthermore, to simplify the distribution of a continuous-time input signal to the various processing branches of a converter according to the representative embodiments of the invention, the analog input filters may be grouped in combinations of two (i.e., conventional diplexers), three (i.e., conventional triplexers), or more. Exemplary circuit 600, illustrated in FIG. 10, uses conventional power splitter 602, in conjunction with triplexers 604A&B to couple continuous-time input signal 101 (one input line 601) to the converter's six processing branches. The alternating arrangement of the filter responses within triplexers 604A&B, allows analog input filters with overlapping passbands to be grouped in a non-overlapping fashion. With respect to circuit 600, in particular, the passband of the filter having center frequency $\omega_0$ (i.e., the first filter in triplexer 604A) preferably overlaps with the passband of the filter having center frequency $\omega_1$ (i.e., the first filter in triplexer 604B), and the passband of the filter having center frequency $\omega_1$ (i.e., the first filter in triplexer 604B) preferably overlaps with the passband of the filter having center frequency $\omega_2$ (i.e., the second filter in triplexer 604A). But the passband of the filter having center frequency $\omega_0$ (i.e., the first filter in triplexer 604A) does not overlap with the passband of the filter having center frequency $\omega_2$ (i.e., the second filter in triplexer 604A), allowing these two filters to be grouped together in conventional triplexer 604A arrangement, without undersired interactions. The outputs of bandpass filters 115, 125 and 135 are then combined in adder 105, and the result is processed by resampling interpolator 119, either with input from an optional sampling error detector 117 (in which case resampling interpolator 119 would be similar to resampling interpolator 119B) or without (in which case resampling interpolator 119 would be similar to resampling interpolator 119A). It is noted that circuit 600 illustrates one way in which K of M total processing branches can be grouped together and processed by a single resampling interpolator (with K=3 and M=6 in the present example), as discussed above. As indicated above, similar circuits can be constructed in which analog bandpass filters (e.g., triplexers 604A&B) are omitted, i.e., in which the input signal 101 is coupled to the inputs of the various sampling/quantization circuits 113 without first being processed by such filters.

As used herein, the term "coupled", or any other form of the word, is intended to mean either directly connected or connected through one or more other processing blocks, e.g., for the purpose of preprocessing.

In the event of any conflict or inconsistency between the disclosure explicitly set forth herein or in the attached drawings, on the one hand, and any materials incorporated by reference herein, on the other, the present disclosure shall take precedence. In the event of any conflict or inconsistency between the disclosures of any applications or patents incorporated by reference herein, the more recently filed disclosure shall take precedence.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for converting a continuous-time, continuously variable signal into a sampled and quantized signal, comprising:
    an input line for accepting an input signal that is continuous in time and continuously variable;
    a plurality of processing branches coupled to the input line, each of said processing branches including: (a) an analog bandpass filter, (b) a sampling/quantization circuit coupled to an output of the analog bandpass filter, and (c) a digital bandpass filter coupled to an output of the sampling/quantization circuit; and
    an adder coupled to outputs of the plurality of processing branches,
    wherein the digital bandpass filters in different ones of the plurality of processing branches have frequency response bandwidths that are centered at different frequencies, and
    wherein the analog bandpass filters in different ones of the plurality of processing branches have frequency responses with bandwidths that are at least 25% greater than the frequency response bandwidths of the digital bandpass filters in their respective processing branches.

2. An apparatus according to claim 1, wherein the analog bandpass filters in different ones of the plurality of processing branches have bandwidths that are at least 50% greater than the frequency response bandwidths of the digital bandpass filters in their respective processing branches.

3. An apparatus according to claim 1, wherein the analog bandpass filter in different ones of the plurality of processing branches have bandwidths that are at least twice the frequency response bandwidths of the digital bandpass filter in their respective processing branches.

4. An apparatus according to claim 1, wherein the frequency response of the analog bandpass filter in at least one of the processing branches is a Butterworth, Chebychev, Bessel, coupled-resonator, or elliptic filter response.

5. An apparatus according to claim 1, wherein the analog bandpass filters are grouped into at least one of: (i) a diplexer, (ii) a triplexer, or (iii) a quadraplexer.

6. An apparatus according to claim 1, wherein the digital bandpass filter in each of a plurality of said processing branches introduces total distortion power limited to less than 40 dB below data converter signal level.

7. An apparatus according to claim 1, wherein the digital bandpass filter in each of a plurality of said processing branches introduces total distortion power limited to less than 60 dB below data converter signal level.

8. An apparatus according to claim 1, wherein the digital bandpass filter in each of a plurality of said processing branches introduces total distortion power limited to less than 80 dB below data converter signal level.

9. An apparatus according to claim 1, wherein the digital bandpass filter in at least one of said processing branches comprises a frequency downconverter, a lowpass filter, and a frequency upconverter.

10. An apparatus according to claim 9, wherein the lowpass filter incorporates at least one recursive moving-average structure.

11. An apparatus according to claim 9, wherein the digital bandpass filter in said at least one of said processing branches incorporates an equalizer having a least one complex tap.

12. An apparatus according to claim 11, wherein the equalizer has plural complex taps.

13. An apparatus according to claim 9, wherein sine and cosine sequences are used by the frequency downconverter and the frequency upconverter for quadrature downconversion and upconversion, respectively, and are generated using a direct digital synthesis method based on digital accumulators and sinusoid lookup tables.

14. An apparatus according to claim 9, wherein sine and cosine sequences are used by the frequency downconverter and the frequency upconverter for quadrature downconversion and upconversion, respectively, and are generated using recursive structures.

15. An apparatus according to claim 9, wherein sine and cosine sequences are used by the frequency downconverter and the frequency upconverter for quadrature downconversion and upconversion, respectively, and wherein at least one of an amplitude or phase of the sine and cosine sequences is adjustable.

16. An apparatus according to claim 1, wherein center frequencies of the plurality of digital bandpass filters are spaced at equal frequency intervals.

17. An apparatus according to claim 1, wherein center frequencies of the plurality of digital bandpass filters are spaced at non-equal frequency intervals.

18. An apparatus according to claim 1, wherein the digital bandpass filter in each of a plurality of said processing branches comprises a recursive window filter.

19. An apparatus for converting a continuous-time, continuously variable signal into a sampled and quantized signal, comprising:
    an input line for accepting an input signal that is continuous in time and continuously variable;
    a plurality of processing branches coupled to the input line, each of said processing branches including: (a) a sampling/quantization circuit, and (b) a digital bandpass filter coupled to an output of the sampling/quantization circuit;
    a plurality of first adders, each combining outputs of at least two of the processing branches;
    a plurality of resampling interpolators, each coupled to an output of one of the first adders; and
    a second adder coupled to outputs of the plurality of resampling interpolators,
    wherein the digital bandpass filters in different ones of the plurality of processing branches have frequency responses that are centered at different frequencies,
    wherein a rate at which at least one of the sampling/quantization circuits operates is different than an overall output data rate of said apparatus, and
    wherein each of the resampling interpolators converts a first signal sample rate used by the sampling/quantization circuits in at least one of its corresponding processing branches to a second signal sample rate that is different than the first signal sample rate.

20. An apparatus according to claim 19, wherein there are at least 4 times as many processing branches as resampling interpolators.

21. An apparatus according to claim 19, wherein there are at least 6/N times as many processing branches as resampling interpolators, where N is an excess-rate oversampling ratio of said apparatus.

22. An apparatus according to claim 19, wherein there are at least 16/N times as many processing branches as resampling interpolators, where N is an excess-rate oversampling ratio of said apparatus.

23. An apparatus according to claim 19, wherein an interpolant used by at least one of the resampling interpolators is generated using an accumulator.

24. An apparatus according to claim 19, wherein an interpolant used by at least one of the resampling interpolators is generated using a numerically-controlled oscillator.

25. An apparatus according to claim 19, wherein each of the processing branches also includes an analog bandpass filter.

26. An apparatus according to claim 19, further comprising an additional resampling interpolator, wherein an output of at least one of the processing branches is coupled directly to the additional resampling interpolator.

27. An apparatus according to claim 19, wherein interpolation used by at least one of the resampling interpolators is second-order.

28. An apparatus according to claim 19, wherein interpolation used by at least one of the resampling interpolators is first-order.

29. An apparatus according to claim 19, wherein the digital bandpass filter in each of a plurality of said processing branches introduces total distortion power limited to less than 40 dB below data converter signal level.

30. An apparatus according to claim 19, wherein the digital bandpass filter in each of a plurality of said processing branches introduces total distortion power limited to less than 60 dB below data converter signal level.

31. An apparatus according to claim 19, wherein the digital bandpass filter in each of a plurality of said processing branches introduces total distortion power limited to less than 80 dB below data converter signal level.

32. An apparatus according to claim 19, wherein the digital bandpass filter in at least one of said processing branches comprises a frequency downconverter, a lowpass filter, and a frequency upconverter.

33. An apparatus according to claim 32, wherein the lowpass filter incorporates at least one recursive moving-average structure.

34. An apparatus according to claim 32, wherein the digital bandpass filter in said at least one of said processing branches incorporates an equalizer having at least one complex tap.

35. An apparatus according to claim 34, wherein the equalizer has plural complex taps.

36. An apparatus according to claim 32, wherein sine and cosine sequences are used by the frequency downconverter and the frequency upconverter for quadrature downconversion and upconversion, respectively, and are generated using a direct digital synthesis method based on digital accumulators and sinusoid lookup tables.

37. An apparatus according to claim 32, wherein sine and cosine sequences are used by the frequency downconverter and the frequency upconverter for quadrature downconversion and upconversion, respectively, and are generated using recursive structures.

38. An apparatus according to claim 32, wherein sine and cosine sequences are used by the frequency downconverter and the frequency upconverter for quadrature downconversion and upconversion, respectively, and wherein at least one of an amplitude or phase of the sine and cosine sequences is adjustable.

39. An apparatus according to claim 19, wherein center frequencies of the plurality of digital bandpass filters are spaced at equal frequency intervals.

40. An apparatus according to claim 19, wherein center frequencies of the plurality of digital bandpass filters are spaced at non-equal frequency intervals.

41. An apparatus according to claim 19, wherein the digital bandpass filter in each of a plurality of said processing branches comprises a recursive window filter.

42. An apparatus according to claim 19, wherein the rates at which the sampling/quantization circuits operate are greater than the overall output data rate of said apparatus, and the resampling interpolators reduce said rates to the overall output data rate of said apparatus.

43. An apparatus according to claim 19, further comprising:
a sampling error detector coupled to at least one of the resampling interpolators,
wherein the output of the sampling error detector is a function of a difference between a rate at which at least one of the sampling/quantization circuits operates and a desired rate.

44. An apparatus according to claim 43, further comprising a second sampling error detector coupled to a different one of the resampling interpolators.

45. An apparatus according to claim 43, wherein the output of the sampling error detector is proportional to the difference between the rate at which said at least one of the sampling/quantization circuits operates and the desired rate.

46. An apparatus according to claim 43, wherein there are at least 4 times as many processing branches as resampling interpolators.

47. An apparatus according to claim 43, wherein an interpolant used by at least one of the resampling interpolators is generated using an accumulator.

48. An apparatus according to claim 43, wherein an interpolant used by at least one of the resampling interpolators is generated using a numerically-controlled oscillator.

49. An apparatus according to claim 43, wherein each of the processing branches also includes an analog bandpass filter.

50. An apparatus according to claim 43, further comprising an additional resampling interpolator, wherein an output of at least one of the processing branches is coupled directly to the additional resampling interpolator.

51. An apparatus according to claim 43, wherein interpolation used by at least one of the resampling interpolators is second-order.

52. An apparatus according to claim 43, wherein interpolation used by at least one of the resampling interpolators is first-order.

53. An apparatus according to claim 43, wherein the digital bandpass filter in each of a plurality of said processing branches introduces total distortion power limited to less than 40 dB below data converter signal level.

54. An apparatus according to claim 43, wherein the digital bandpass filter in each of a plurality of said processing branches introduces total distortion power limited to less than 60 dB below data converter signal level.

55. An apparatus according to claim 43, wherein the digital bandpass filter in each of a plurality of said processing branches introduces total distortion power limited to less than 80 dB below data converter signal level.

56. An apparatus according to claim 43, wherein the digital bandpass filter in at least one of said processing branches comprises a frequency downconverter, a lowpass filter, and a frequency upconverter.

57. An apparatus according to claim 56, wherein the lowpass filter incorporates at least one recursive moving-average structure.

58. An apparatus according to claim 56, wherein the digital bandpass filter in said at least one of said processing branches incorporates an equalizer having at least one complex tap.

59. An apparatus according to claim 58, wherein the equalizer has plural complex taps.

60. An apparatus according to claim 56, wherein sine and cosine sequences are used by the frequency downconverter and the frequency upconverter for quadrature downconversion and upconversion, respectively, and are generated using a direct digital synthesis method based on digital accumulators and sinusoid lookup tables.

61. An apparatus according to claim 56, wherein sine and cosine sequences are used by the frequency downconverter and the frequency upconverter for quadrature downconversion and upconversion, respectively, and are generated using recursive structures.

62. An apparatus according to claim 56, wherein sine and cosine sequences are used by the frequency downconverter and the frequency upconverter for quadrature downconversion and upconversion, respectively, and wherein at least one of an amplitude or phase of the sine and cosine sequences is adjustable.

63. An apparatus according to claim 43, wherein center frequencies of the plurality of digital bandpass filters are spaced at equal frequency intervals.

64. An apparatus according to claim 43, wherein center frequencies of the plurality of digital bandpass filters are spaced at non-equal frequency intervals.

65. An apparatus according to claim 43, wherein the digital bandpass filter in each of a plurality of said processing branches comprises a recursive window filter.

66. An apparatus according to claim 43, wherein the sampling error detector includes at least one delay element.

67. An apparatus according to claim 66, wherein the delay element provides a delay of an integer value of at least one divided by the desired rate.

68. An apparatus according to claim 66, wherein the delay element comprises at least one of: (i) a passive lumped-element network, (ii) a transmission line, (iii) a passive distributed-element network, (iv) an active delay buffer, and (v) a piezoelectric device.

69. An apparatus according to claim 43, wherein the rates at which the sampling/quantization circuits operate are greater than the overall output data rate of said apparatus, and the resampling interpolators reduce said rates to the overall output data rate of said apparatus.

* * * * *

UNITED STATES PATENT AND TRADEMARK OFFICE
CERTIFICATE OF CORRECTION

PATENT NO. : 8,581,768 B1  
APPLICATION NO. : 13/535037  
DATED : November 12, 2013  
INVENTOR(S) : Christopher Pagnanelli Page 1 of 1

It is certified that error appears in the above-identified patent and that said Letters Patent is hereby corrected as shown below:

In the Specification

In column 2 line 37, change " $N_0 = \sigma_\phi^2/(1/2 \cdot f_{CLK}))$ " to -- $N_0 = \sigma_\varphi^2/\left(\frac{1}{2} \cdot f_{CLK}\right)$ --.

In column 2 line 41, change " $\hat{y}(n) \approx A_m \sin(\omega_m T \cdot n + \phi_m) + A_m \cos(\omega_m T \cdot n + \phi_m) \cdot (\omega_m \cdot \phi)$ " to -- $\hat{y}(n) \approx A_m \cdot \sin(\omega_m T \cdot n + \phi_m) + A_m \cdot \cos(\omega_m T \cdot n + \phi_m) \cdot (\omega_m \cdot \varphi)$ --.

In column 2 line 66, change "(-π, +π," to --(-π, +π],--.

In column 4 line 66, change "MBAΔΣ" to -- MBΔΣ--.

In column 5 line 6, change "MBAΔΣ" to --MBΔΣ--.

In column 14 line 44, change " $\hat{y}_k(n) = A_k \sin(\Omega_k T \cdot n + \phi_n + \omega_k \cdot \phi)$ " to -- $\hat{y}_k(n) = A_k \sin(\omega_k T \cdot n + \phi_n + \omega_k \cdot \varphi)$ --.

In column 14 line 45, change " $|\phi| << 1$ " to -- $|\varphi| << 1$ --.

In column 14 line 55, change " $\sum_{k=0}^{M-1} [A_k \cdot \sin(\omega_k T \cdot n + \phi_k) \cdot (\omega_k \cdot \varphi)] * g_k(n)$ " to -- $\sum_{k=0}^{M-1} [A_k \cdot \cos(\omega_k T \cdot n + \varphi_k) \cdot (\omega_k \cdot \phi)] * g_k(n)$ --.

Signed and Sealed this  
Eleventh Day of March, 2014

Michelle K. Lee  
*Deputy Director of the United States Patent and Trademark Office*

UNITED STATES PATENT AND TRADEMARK OFFICE
CERTIFICATE OF CORRECTION

PATENT NO. : 8,581,768 B1
APPLICATION NO. : 13/535037
DATED : November 12, 2013
INVENTOR(S) : Christopher Pagnanelli Page 1 of 1

It is certified that error appears in the above-identified patent and that said Letters Patent is hereby corrected as shown below:

In the Specification

In column 2 line 33, change " $\hat{y}_k(n) = A_m \sin(\omega_m T \cdot n + \phi_m + \omega_m \cdot \phi)$ " to -- $\hat{y}_k(n) = A_m \sin(\omega_m T \cdot n + \phi_m + \omega_m \cdot \varphi)$ --.

In column 2 line 34, change "and $\phi$ is a white" to --and $\varphi$ is a white--.

In column 14 line 55, change " $\sum_{k=0}^{M-1} [A_k \cdot \sin(\omega_k T \cdot n + \phi_k) \cdot (\omega_k \cdot \varphi)] * g_k(n)$ " to -- $\sum_{k=0}^{M-1} [A_k \cdot \cos(\omega_k T \cdot n + \phi_k) \cdot (\omega_k \cdot \varphi)] * g_k(n)$ --.

Signed and Sealed this
Second Day of June, 2015

Michelle K. Lee
*Director of the United States Patent and Trademark Office*